United States Patent
Maggi et al.

(10) Patent No.: US 10,714,468 B2
(45) Date of Patent: Jul. 14, 2020

(54) OPTICAL INTEGRATED CIRCUIT SYSTEMS, DEVICES, AND METHODS OF FABRICATION

(71) Applicant: STMicroelectronics S.r.l., Agrate Brianza (IT)

(72) Inventors: Luca Maggi, Garlate (IT); Piero Orlandi, Arcevia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/279,092

(22) Filed: Feb. 19, 2019

(65) Prior Publication Data

US 2020/0013771 A1     Jan. 9, 2020

Related U.S. Application Data

(63) Continuation of application No. 16/028,263, filed on Jul. 5, 2018, now Pat. No. 10,262,984.

(51) Int. Cl.
| | |
|---|---|
| *H01L 23/60* | (2006.01) |
| *G02B 6/13* | (2006.01) |
| *H02H 9/04* | (2006.01) |
| *H01L 23/02* | (2006.01) |
| *G02B 6/122* | (2006.01) |
| *H01L 27/02* | (2006.01) |
| *G02B 6/12* | (2006.01) |

(52) U.S. Cl.
CPC ........ *H01L 27/0248* (2013.01); *G02B 6/1228* (2013.01); *G02B 6/13* (2013.01); *H01L 23/60* (2013.01); *H02H 9/045* (2013.01); *G02B 2006/12061* (2013.01); *G02B 2006/12123* (2013.01)

(58) Field of Classification Search
CPC ....... H01L 23/60; H01L 27/0248; G02B 6/13; G02B 6/122; G02B 6/1228; H02H 23/60; H02H 9/45
USPC .......................................................... 385/14
See application file for complete search history.

(56) References Cited

U.S. PATENT DOCUMENTS

| | | | |
|---|---|---|---|
| 6,501,136 B1 * | 12/2002 | Lin | .................. H01L 29/41758 257/355 |
| 6,987,913 B2 | 1/2006 | Blauvelt et al. | |
| 8,958,670 B2 | 2/2015 | Delacour et al. | |
| 9,024,402 B2 | 5/2015 | Kang et al. | |
| 9,632,249 B1 | 4/2017 | Dangel et al. | |
| 9,806,112 B1 | 10/2017 | Celo et al. | |
| 9,871,343 B2 | 1/2018 | Menezo | |

(Continued)

*Primary Examiner* — Akm E Ullah
(74) *Attorney, Agent, or Firm* — Slater Matsil, LLP

(57) ABSTRACT

An optical integrated circuit device includes a semiconductor substrate and a first waveguide made of a first material and disposed over the semiconductor substrate. The first waveguide includes a parallel region and a tapered region. The optical integrated circuit device further includes a first cladding structure disposed over and surrounding the parallel region of the first waveguide, a first extension made of the first material and disposed over the semiconductor substrate, and an electrostatic discharge (ESD) protection structure electrically coupled to the first extension. The first extension physically contacts the parallel region of the first waveguide. The first extension includes a first portion within the first cladding structure and a second portion outside the first cladding structure.

20 Claims, 18 Drawing Sheets

(56) References Cited

U.S. PATENT DOCUMENTS

| | | |
|---|---|---|
| 9,891,450 B2 | 2/2018 | Baudot et al. |
| 9,933,566 B2 | 4/2018 | Patel et al. |
| 10,236,378 B2 * | 3/2019 | Sambi .................. H01L 29/7816 |
| 10,262,984 B1 * | 4/2019 | Maggi .................. G02B 6/1228 |
| 2006/0098351 A1 * | 5/2006 | Iben .......................... G11B 5/40 |
| | | 360/323 |
| 2007/0280605 A1 | 12/2007 | Mendoza |
| 2008/0025665 A1 | 1/2008 | Little |
| 2009/0324162 A1 | 12/2009 | Assefa et al. |
| 2017/0317116 A1 | 11/2017 | Celo et al. |
| 2018/0246351 A1 * | 8/2018 | Ho ....................... G02F 1/01708 |
| 2020/0003950 A1 * | 1/2020 | Yu .......................... G02B 6/124 |

\* cited by examiner

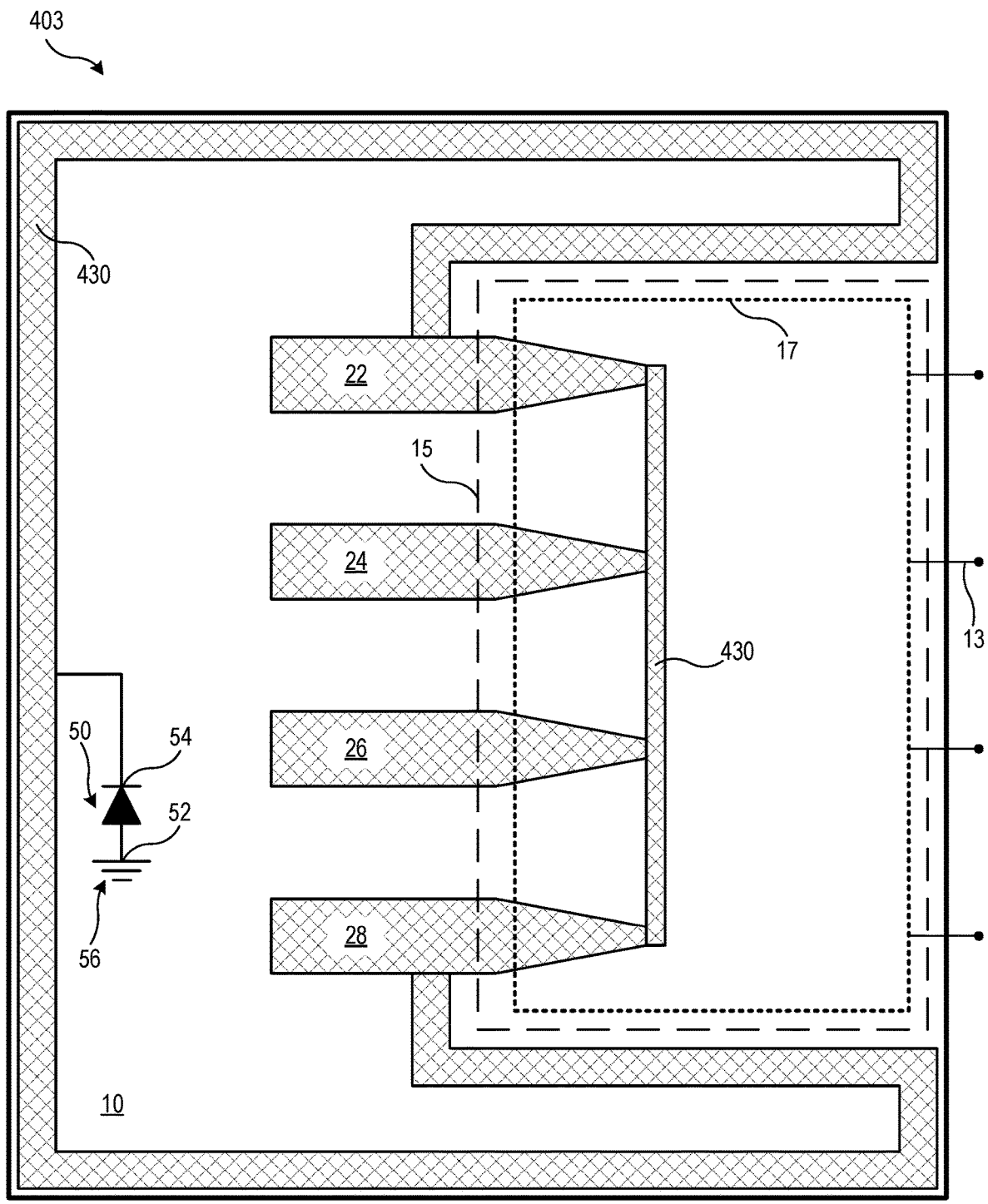
*Fig. 4*B

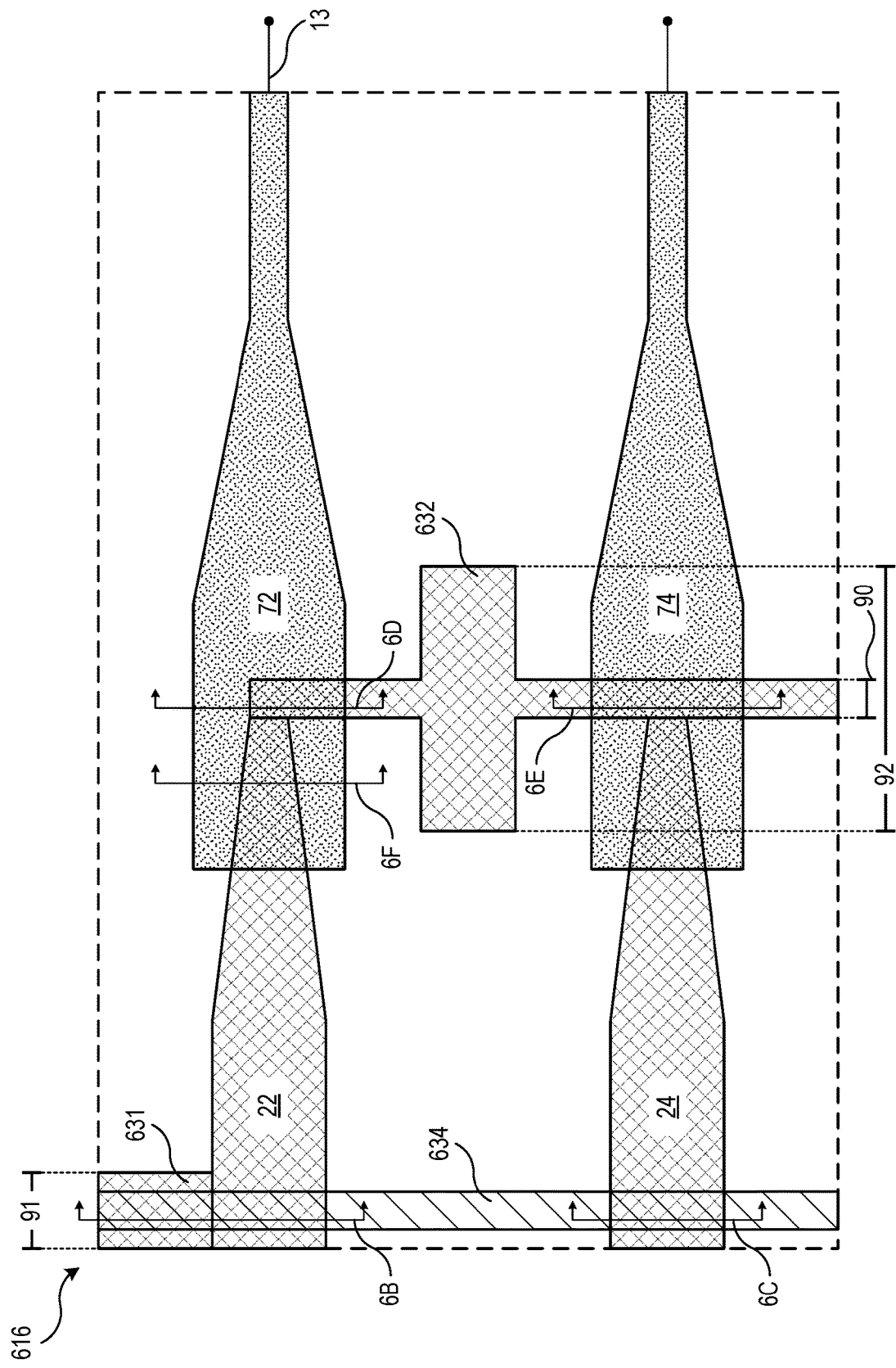

OPTICAL INTEGRATED CIRCUIT SYSTEMS, DEVICES, AND METHODS OF FABRICATION

CROSS-REFERENCE TO RELATED APPLICATIONS

This application is a continuation application of U.S. application Ser. No. 16/028,263 filed on Jul. 5, 2018, which application is hereby incorporated herein by reference in its entirety.

TECHNICAL FIELD

The present invention relates generally to an optical integrated circuit system, and, in particular embodiments, to structures of optical integrated circuit systems, optical integrated circuit devices, and methods of fabrication thereof.

BACKGROUND

Optical integrated circuits (OICs) may be sensitive to electrostatic discharge (ESD) events. In many applications, back end-of-line (BEOL) metallization may be formed on top of the optical layer of a photonic chip. The BEOL layers may be used for routing electrical signals as well as to form a seal ring around the photonic chip. The seal ring may be formed around the perimeter of OICs to provide protection from potentially harmful ESD events. For example, the seal ring may be electrically coupled to an ESD diode which may provide a pathway to a ground connection in the presence of high voltage and/or current conditions. However, seal rings formed exclusively from metal layers may not provide complete protection from potentially harmful ESD events when the photonic chip includes external optical connections.

For example, in applications where a cavity in the BEOL layers is utilized to facilitate optical coupling between an OIC and an interposer, the optical coupling may be achieved using adiabatic or evanescent coupling between OIC waveguides and interposer waveguides. In this case, adiabatic coupling between the waveguides may require openings to be formed in the metal layers of a BEOL seal ring. Depending on the waveguide and cladding materials, these openings may allow electrical charge to pass through the seal ring during an ESD event. Therefore, a seal ring that is compatible with external optical connections while maintaining a high level of electrical isolation may be desirable.

SUMMARY

In accordance with an embodiment of the invention, an optical integrated circuit device includes an electrically insulating substrate, an optical connection disposed at a boundary of the optical integrated circuit, and a first electrostatic discharge (ESD) protection structure in direct contact with and electrically coupled to the first waveguide. The optical connection includes a first waveguide. The first waveguide is disposed on the electrically insulating substrate and configured to transmit an optical signal. The first ESD protection structure is both electrically non-insulating and substantially optically transparent to the optical signal. An ESD diode including an anode and a cathode is electrically coupled to the first ESD protection structure. A ground connection is electrically coupled to the anode of the ESD diode.

In accordance with another embodiment of the invention, a method of fabricating an optical integrated circuit device includes providing an electrically insulating substrate, forming a first waveguide over the electrically insulating substrate. The first waveguide is configured to transmit an optical signal. The method further includes forming a first electrostatic discharge (ESD) protection structure over the electrically insulating substrate. The first ESD protection structure is in direct contact with and electrically coupled to the first waveguide. The first ESD protection structure is both electrically non-insulating and substantially optically transparent to the optical signal. The method also includes forming an ESD diode at the electrically insulating substrate and forming a ground connection at the electrically insulating substrate. A cathode of the ESD diode is electrically coupled to the first ESD protection structure. The ground connection is electrically coupled to an anode of the ESD diode.

In accordance with still another embodiment of the invention, a system includes an electrically insulating substrate, an optical integrated circuit (OIC) disposed over the electrically insulating substrate, and a plurality of waveguides disposed over the electrically insulating substrate and optically coupled to the OIC. The plurality of waveguides is configured to transmit a plurality of optical signals. The plurality of waveguides includes a first waveguide and a second waveguide. The system further includes an external circuit optically coupled to the plurality of waveguides, a first seal ring disposed around a perimeter of the OIC, an ESD diode comprising an anode and a cathode, and a ground connection electrically coupled to the anode of the ESD diode. The first seal ring includes a first portion in direct contact with and electrically coupled to each of the plurality of waveguides. The first portion is both electrically non-insulating and substantially optically transparent to the plurality of optical signals. The first seal ring also includes a second portion. The first portion and the second portion form a closed loop. The cathode is electrically coupled to the first seal ring.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A illustrates a top view of the OIC system and FIGS. 2B and 2C illustrate cross-sectional views of the OIC system in accordance with an embodiment of the invention;

FIGS. 4A and 4B illustrate schematic diagrams of two example OIC systems including an ESD protection structure disposed along the perimeter of an OIC device and in direct contact with four waveguides, wherein FIG. 4A illustrates four waveguides adiabatically coupled to four secondary waveguides, and wherein FIG. 4B illustrates four waveguides adiabatically coupled to waveguides of an external interposer in accordance with an embodiment of the invention;

FIGS. 6A, 6B, 6C, 6D, 6E, and 6F illustrate a schematic diagram of a portion of an example OIC system including a first ESD protection structure in direct contact with a first waveguide and a second waveguide, and a second ESD protection structure that does not directly contact the first waveguide or the second waveguide, where FIG. 6A illustrates a top view of the portion, and where FIGS. 6B-6F illustrate cross-sectional views of the portion in accordance with an embodiment of the invention;

FIG. 7A illustrates a top view of the portion, and where FIGS. 7B-7E illustrate cross-sectional views of the portion in accordance with an embodiment of the invention.

Figure 1:
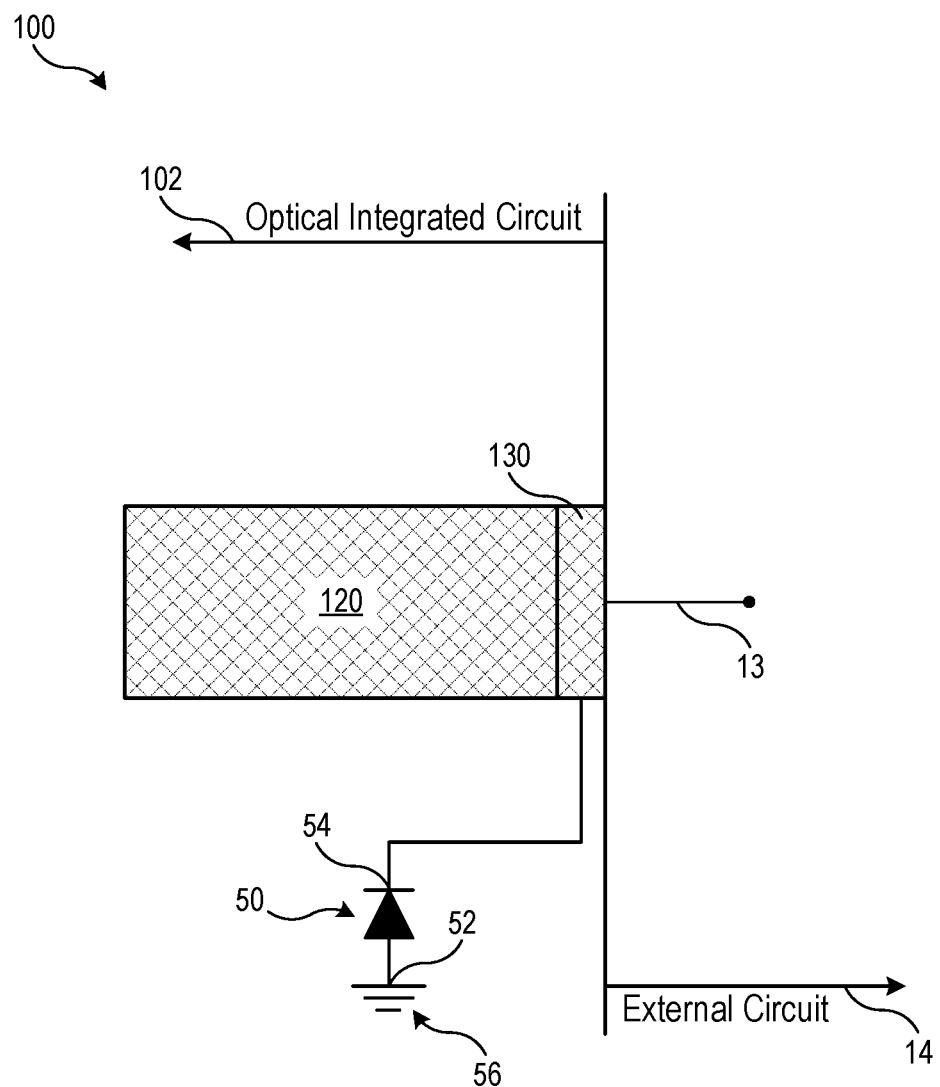
FIG. 1 illustrates a schematic diagram of an example optical integrated circuit (OIC) system including an electrostatic discharge (ESD) protection structure in direct contact with a waveguide in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

A seal ring may be formed using back end-of-line (BEOL) layers to protect optical integrated circuits (OICs) from potentially harmful electrostatic discharge (ESD) events. The seal ring may be an ESD protection structure that surrounds or partially surrounds circuits that are vulnerable to ESD events such as OICs. Since a seal ring formed during BEOL processing of a photonic chip may be metal, the seal ring may be opaque to some or all of the optical signals that are transmitted by the OICs of the photonic chip. In order to allow optical connections to external circuits, openings may be formed in the seal ring so that waveguides may pass through the seal ring. Specifically, openings in the seal ring may be incorporated to achieve adiabatic coupling between waveguides of an OIC and an external interposer. In this case a cavity may be formed in the BEOL layers to enable external optical coupling through attachment of an external interposer.

However, openings in the seal ring may compromise the electrical isolation afforded by the seal ring by allowing electrical charge to be transported through the openings into the photonic chip. As a specific example, if waveguides passing through the seal ring are not electrically insulating, electrical charge may be transported through the waveguides themselves.

In various embodiments, an OIC system includes an OIC device. The OIC device includes an optical connection comprising at least one waveguide configured to transmit an optical signal. An ESD protection structure is in direct contact with the waveguide and is electrically coupled to the waveguide. The ESD protection structure is configured to provide a pathway to a ground connection through an ESD diode during an ESD event. The ESD protection structure is further configured to be optically inert with respect to the waveguide. In other words, the ESD protection structure is configured to provide ESD protection without affecting the optical properties of the OIC device.

The dimensions of the ESD protection structure may be relatively small in regions that are in close proximity to a waveguide, and may be relatively large in other regions. The ESD protection structure may surround the OIC device in some embodiments. For example, the ESD protection structure may be disposed along a perimeter of the OIC device and may be referred to as an optical seal ring. The optical seal ring may optionally be formed from the same material as the waveguide. In various embodiments, the optical seal ring is formed at the same time as the waveguide. In some embodiments, a portion of the waveguide may be configured to function as part of the optical seal ring.

The OIC system optionally includes an additional ESD protection structure that is not in direct contact with the waveguide. The additional ESD protection structure may be formed during BEOL processes and may surround or partially surround the OIC device. For example, the additional ESD protection structure may be disposed along a perimeter of the OIC device and may be referred to as a BEOL seal ring. In various embodiments, the BEOL seal ring has one or more openings which allow the at least one waveguide to pass through without affecting the optical properties of transmitted optical signals. In various embodiments the BEOL seal ring is electrically coupled to the optical ESD protection structure. In some embodiments, the BEOL seal ring is formed directly above a portion of the optical ESD protection structure. In one embodiment, the OIC system includes both a BEOL seal ring and an optical seal ring.

The OIC system may advantageously allow waveguides to be used as external connections of an OIC device while maintaining ESD protection. The OIC system may also provide the benefit of improving ESD protection of an OIC device when external optical connections are included. An ESD structure such as an optical seal ring may advantageously be electrically connected to a BEOL seal ring. Another possible benefit of the OIC system is that ESD protection structures such as an optical seal ring may be configured not to affect the optical properties of the waveguides or the OIC device. The OIC system may also advantageously allow the use of semiconductors and/or conductors as waveguide materials without sacrificing ESD protection of the OIC device.

Embodiments provided below describe various structures and methods of fabricating optical integrated circuit systems and devices, and in particular, optical integrated circuit systems that include an electrostatic discharge protection structure in direct contact with a waveguide. The following description describes the embodiments. Two embodiment OIC systems that include an ESD protection structure in direct contact with a waveguide are described using FIGS. 1 and 2A-2C. Several embodiment OIC systems that include an ESD protection structure in direct contact with a plurality of waveguides are described using FIGS. 3-5. A portion of an embodiment OIC system that includes two ESD protection structures is described using FIGS. 6A-6F. A portion of another embodiment OIC system that includes two ESD protection structures is described using FIGS. 7A-7E. A method of fabricating an embodiment OIC device is described using FIG. 8.

FIG. 1 illustrates a schematic diagram of an example optical integrated circuit (OIC) system including an electrostatic discharge (ESD) protection structure in direct contact with a waveguide in accordance with an embodiment of the invention.

Referring to FIG. 1, an OIC system 100 includes an OIC device 102. In one embodiment, the OIC device 102 may be implemented as a photonic chip. In other embodiments, OIC device 102 may be included on a substrate that includes additional circuits. For example, the OIC device 102 may be included on a substrate that also includes additional optical circuitry, electrical circuitry, microelectromechanical devices, and the like. The OIC device 102 may also be included on a substrate with additional integrated and/or discrete components.

The OIC device 102 includes a waveguide 120 and an ESD protection structure 130. In various embodiments, the waveguide 120 is an integrated waveguide. In some embodiments, the waveguide 120 is a single-mode waveguide. In other embodiments, the waveguide 120 is a multi-mode waveguide. Waveguide 120 may be implemented using any suitable structure as may be desired based on specific application parameters. For example, waveguide 120 may be a planar waveguide, strip waveguide, ridge waveguide, rib waveguide, diffused waveguide, buried waveguide, or any other suitable type of waveguide. The waveguide 120 may be implemented using any suitable material. For example, waveguide 120 may comprise elemental silicon (Si), silicon nitride ($Si_3N_4$), lithium niobate ($LiNbO_3$), zinc selenide (ZnSe), an optically suitable polymer, or a III-V semiconductor such as gallium arsenide (GaAs), gallium nitride (GaN), among others. In various embodiments, waveguide 120 is an integrated strip waveguide and is a silicon integrated strip waveguide in one embodiment. In another embodiment, waveguide 120 is an integrated ridge waveguide and is a silicon integrated ridge waveguide in one embodiment.

The waveguide 120 may be part of an optical connection 13 of the OIC device 102. The optical connection 13 may be disposed at a boundary of the OIC device 102. For example, waveguide 120 of the optical connection 13 may be adiabatically coupled to an external interposer. Additional optical components such as additional waveguides may be included between waveguide 120 and an external interposer. Alternatively, an external interposer may be directly coupled to waveguide 120. In other embodiments, additional electrical components or electro-optical components may be included in optical connection 13.

In various embodiments, the waveguide 120 is configured to be optically coupled to an external circuit 104, for example using optical connection 13. External circuit 14 may be disposed on a different substrate than OIC device 102. Alternatively, external circuit 14 may be disposed on the same substrate as OIC device 102. External circuit 14 may include any combination of suitable components such as electrical components, optical components, active and passive devices, integrated and discrete devices, and the like.

As shown in FIG. 1, the ESD protection structure 130 is in direct contact with waveguide 120. The ESD protection structure 130 may be disposed at a boundary of OIC device 102 such as at a point along the perimeter of the OIC device 102. Alternatively, the ESD protection structure 130 may be located at any point adjacent to and directly contacting waveguide 120. ESD protection structure 130 is electrically coupled to waveguide 120. The ESD protection structure 130 is formed from an electrically non-insulating (e.g. conducting, semiconducting, superconducting) material. In one embodiment, the ESD protection structure 130 formed from a semiconducting material. In another embodiment, the ESD protection structure 130 is formed from an electrically conductive material.

ESD protection structure 130 is substantially optically transparent in various embodiments. For example, in one embodiment, the ESD protection structure 130 is substantially optically transparent to optical signals transmitted by waveguide 120. In various embodiments, the ESD protection structure 130 is formed from the same material as waveguide 120. In one embodiment, the ESD protection structure 130 is formed from elemental silicon (Si). In various embodiments, the ESD protection structure 130 may be any electrically non-insulating material suitable for forming waveguide 120 as previously described.

In various embodiments, the ESD protection structure 130 is configured to be optically inert with respect to optical signals transmitted by waveguide 120. In other words, ESD protection structure 130 may be configured not to affect the functionality of the OIC device 102 while also protecting the OIC device 102 from potentially harmful ESD events. For example, the OIC device 102 may include functionalities such as modulation and detection which are not affected by the presence of the ESD protection structure 130.

In applications where the waveguide 120 and the ESD protection structure 130 are formed from the same material, the ESD protection structure 130 may be configured to reduce or eliminate scattering of optical signals transmitted by waveguide 120 by minimizing or removing the interface between the waveguide 120 and the ESD protection structure 130. Alternatively or additionally, the dimensionality of ESD protection structure 130 may be chosen to reduce or eliminate scattering of optical signals transmitted by waveguide 120.

The ESD protection structure 130 is electrically coupled to a cathode 54 of an ESD diode 50. The ESD diode 50 also includes an anode 52 which is electrically coupled to a ground connection 56. ESD protection structure 130 is configured to provide a low resistance pathway to ground connection 56 through ESD diode 50. For example, during an ESD event, high voltage may initiate breakdown of the ESD diode 50 which may provide a pathway that shunts current to ground connection 56 and away from components in OIC device 102.

In the schematic diagram of OIC system 100, ESD protection structure 130 is configured to prevent excess electrical charge from flowing into waveguide 120. Rather, in the event that the voltage at the cathode 54 of ESD diode 50 reaches potentially harmful levels, the ESD diode 50 is configured to allow most or all of the current to flow to ground connection 56.

It should be noted that ESD protection structure 130 may extend to protect other possibly vulnerable regions of OIC device 102. For example, additional waveguides, electric circuits, and other components may be included in OIC device 102. ESD protection structure 130 may extend to protect these additional components as desired for a given application. For example, waveguide 120 may be part of an array of waveguides of a photonic chip that form adiabatic optical connections to external optical circuits. ESD protection structure 130 may extend to protect all of the optical connections located at a boundary such as along the perimeter of the OIC device 102. In various embodiments, ESD protection structure 130 extends around a perimeter of OIC device 102. In this case, ESD protection structure 130 may be referred to as an optical seal ring.

Figure 2A:
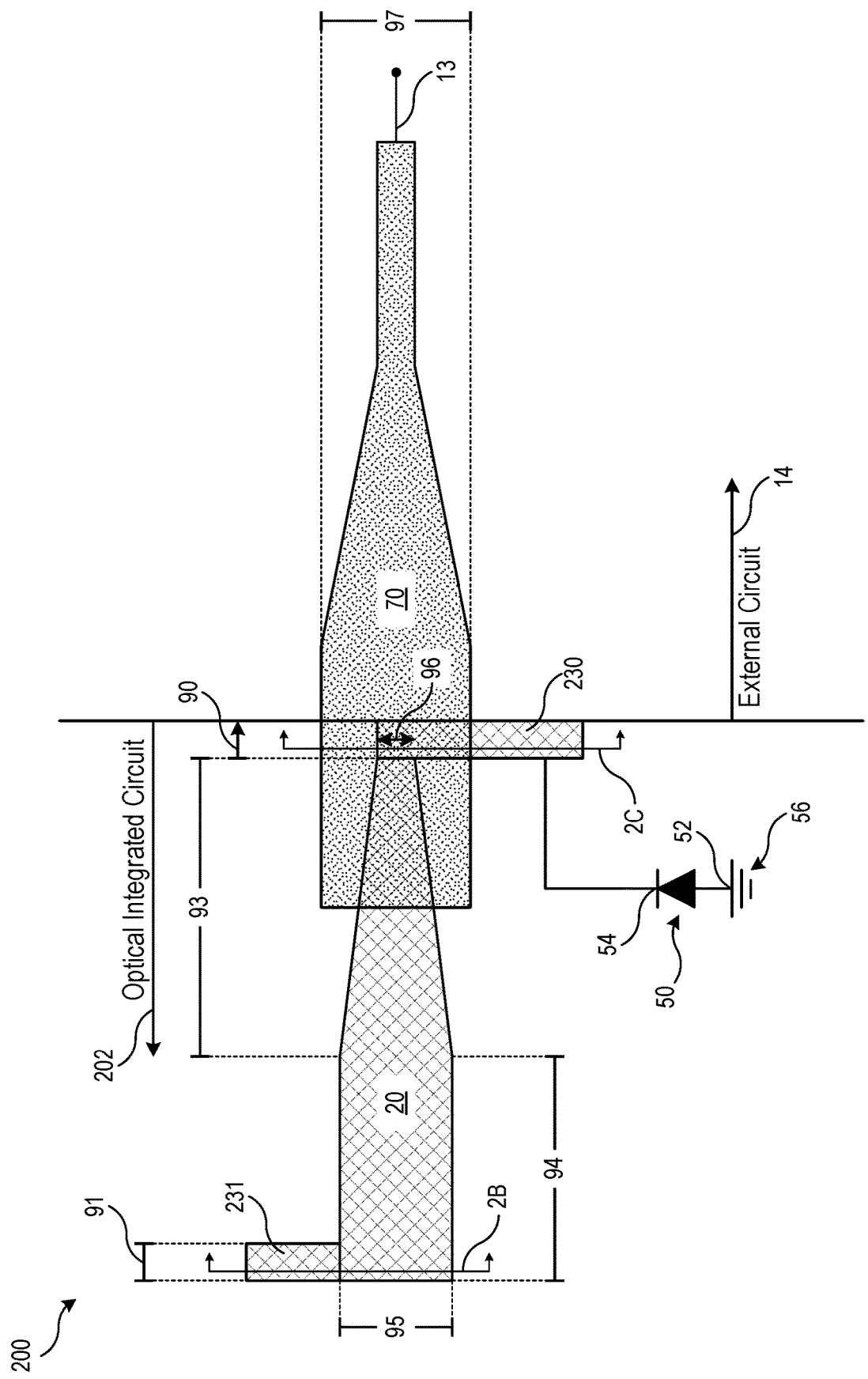
FIGS. 2A, 2B, and 2C illustrate a schematic diagram of another example OIC system including an ESD protection structure in direct contact with a waveguide, where
Figure 2B:
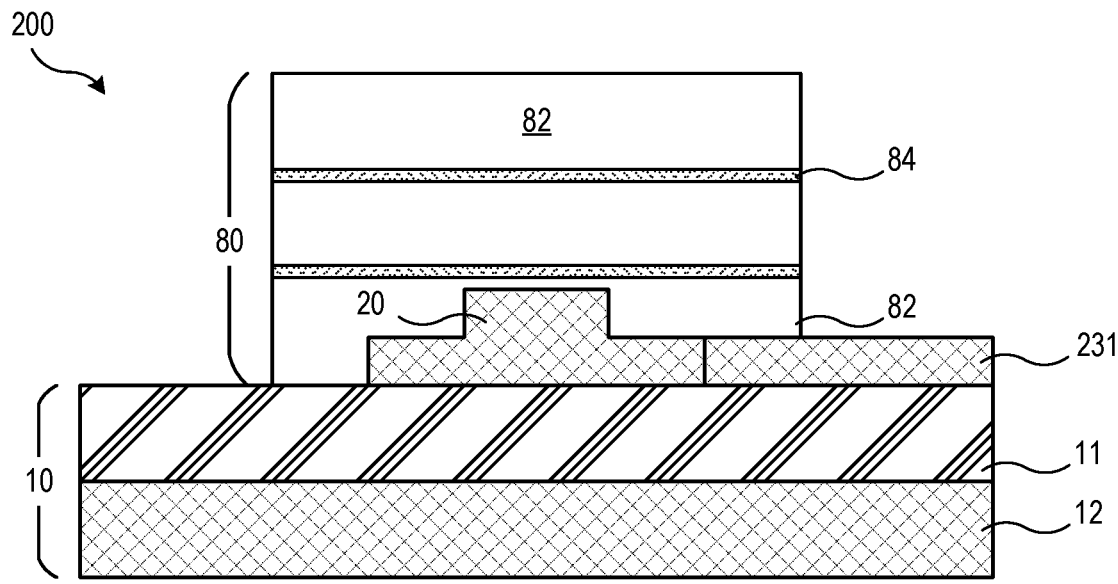
Figure 2C:
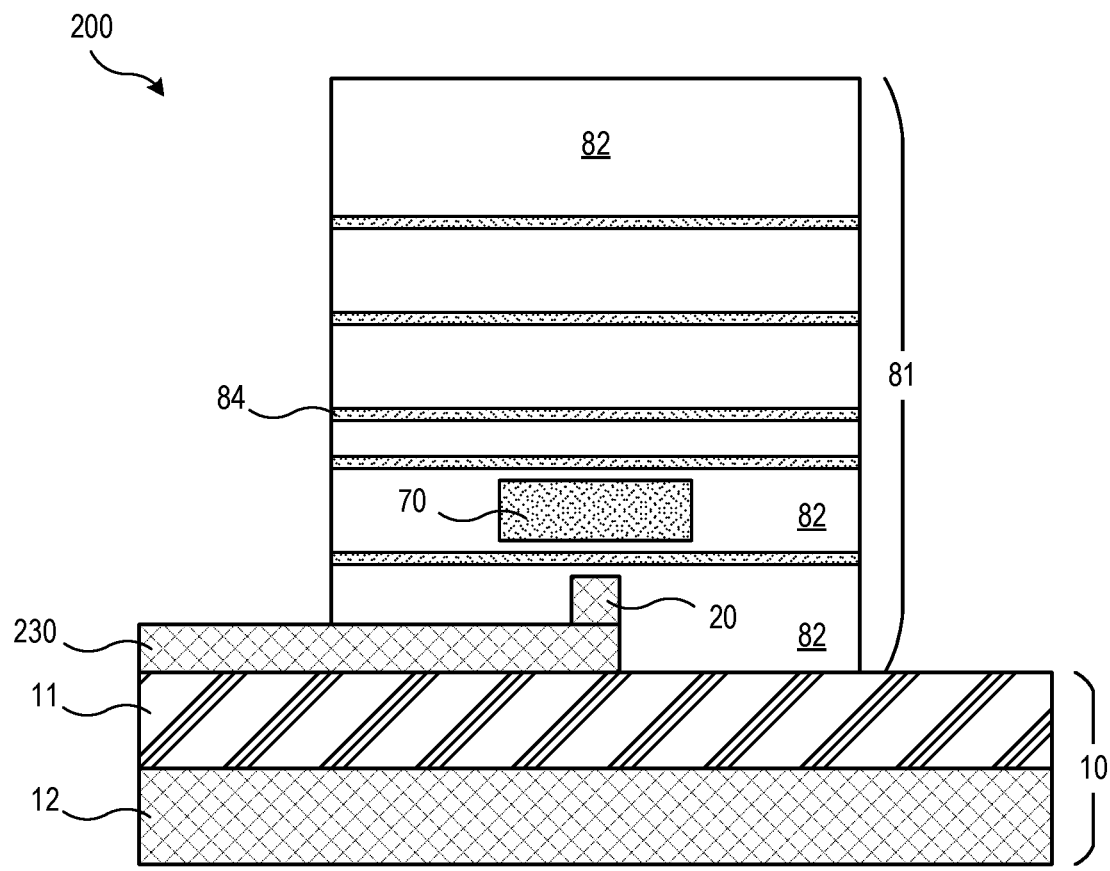

FIGS. 2A, 2B, and 2C illustrate a schematic diagram of another example OIC system including an ESD protection structure in direct contact with a waveguide, where FIG. 2A illustrates a top view of the OIC system and FIGS. 2B and 2C illustrate cross-sectional views of the OIC system in accordance with an embodiment of the invention.

Referring to FIG. 2A, an OIC system 200 includes an OIC device 202. The OIC system 200 including OIC device 202 may be a specific implementation of other embodiment OC systems and OIC devices such as OIC system 100 including OIC device 102 as described in reference to FIG. 1, for example. Similarly labeled elements may be as previously described.

OIC device 202 includes a waveguide 20 optically coupled to a secondary waveguide 70. The waveguide 20 may be tapered such that an adiabatic coupling is achieved between waveguide 20 and the secondary waveguide 70. In various embodiments, an index of refraction $n_1$ of waveguide 20 is greater than an index of refraction $n_2$ of the secondary waveguide 70. Secondary waveguide 70 may in turn be coupled to an optical connection 13 that facilitates optical coupling to an external circuit 14. For example, the secondary waveguide 70 may be adiabatically coupled to a waveguide on an external interposer that is coupled to the external circuit 14. The interposer waveguide may be polymer or glass and have an index of refraction $n_3$ that is less than that of the secondary waveguide 70. In other words, the indices of refraction may be implemented such that $n_1 > n_2 > n_3$ so that adiabatic coupling is achieved between waveguide 20 and the external optical circuit 14.

An ESD protection structure 230 is in direct contact with and is electrically coupled to waveguide 20. The ESD protection structure 230 is further electrically coupled to a ground connection 56 through an ESD diode 50 as previously described.

ESD protection structure 230 may be a specific implementation of ESD protection structure 130 of FIG. 1 and may be as previously described. The ESD protection structure 230 may include a first width 90. For example, the first width 90 may be a thickness of the ESD protection structure 230 that is measured in a direction parallel to the direction of propagation of an optical signal that is traveling through waveguide 20. The first width 90 may be chosen so that the properties of the optical signal are not affected by the presence of ESD protection structure 230. In one embodiment, the first width 90 is chosen so that an adiabatic coupling between the waveguide 20 and the secondary waveguide 70 is maintained. In some embodiments, the first width 90 is less than 200 nm. In various embodiments, the first width 90 is between about 50 nm and about 200 nm. In one embodiment, the first width 90 is about 180 nm. In another embodiment, the first width 90 is about 100 nm.

Figure 3:
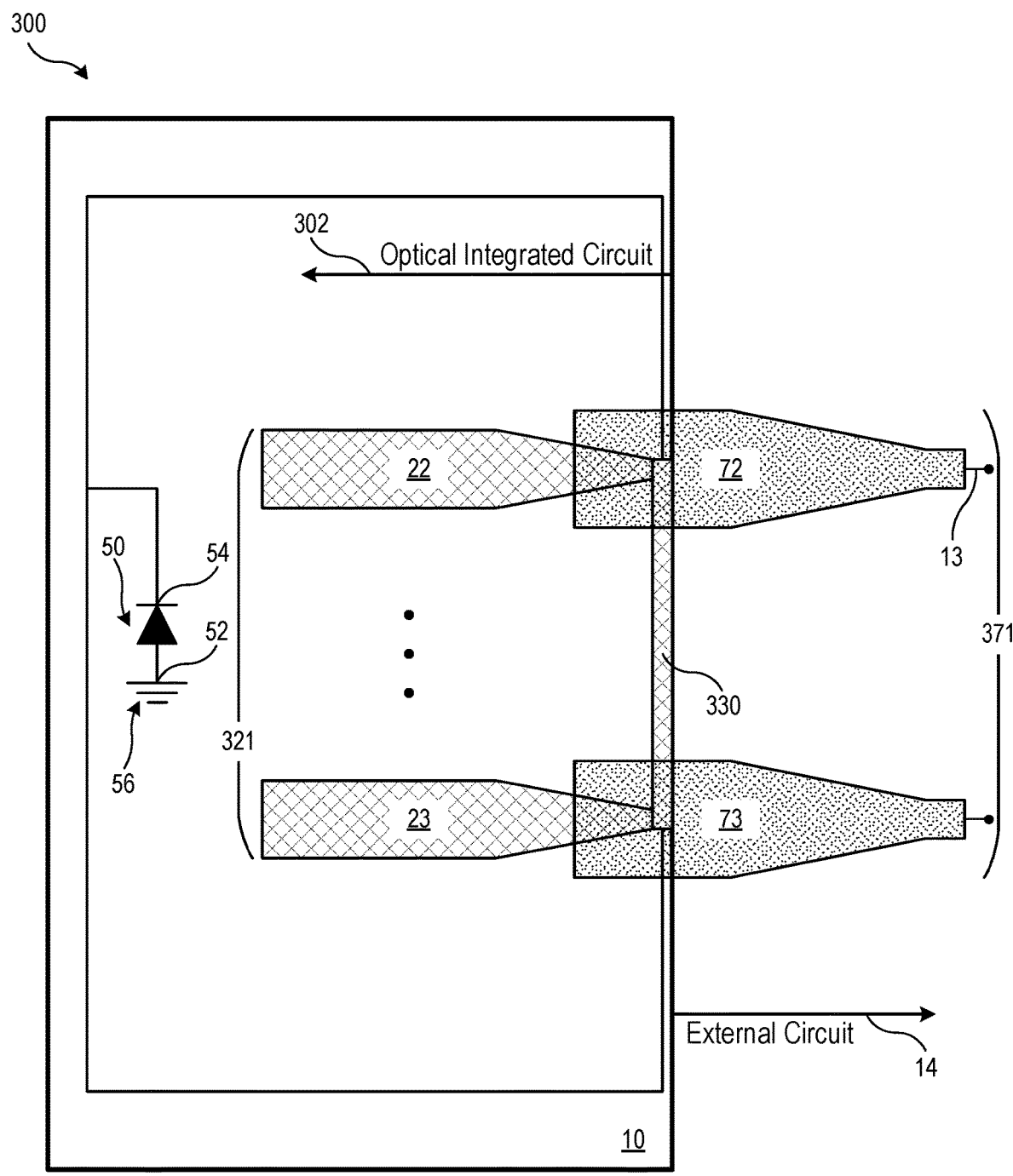
FIG. 3 illustrates a schematic diagram of an example OIC system including an ESD protection structure in direct contact with a plurality of waveguides in accordance with an embodiment of the invention.

The ESD protection structure 230 may include an ESD protection structure extension 231 in direct contact with a side portion of the waveguide 20 as shown. For example, the waveguide 20 may be formed from an electrically non-insulating material and may function to electrically couple the ESD protection structure 230 to the ESD protection structure extension 231. Alternatively, for example as illustrated in FIG. 3, the ESD protection structure 230 may extend past the waveguide 20 and the ESD protection structure extension 231 may be omitted.

The ESD protection structure extension 231 includes a second width 91. The second width 91 may be a measure of the thickness of the ESD protection structure extension 231 near the side portion of waveguide 20. The second width 91 may be the same or different from the first width 90. In various embodiments, the second width 91 is greater than the first width 90. In some embodiments, the second width 91 is greater than 200 nm. In some embodiments, the second width 91 is between about 250 nm and about 2 μm. In one embodiment, the second width 91 is about 400 nm. In another embodiment, the second width 91 is about 1.8 μm. In other embodiments, the second width 91 is between about 2 μm and about 5 μm. In one embodiment, the second width 91 is about 3 μm. For example, the ESD protection structure extension 231 may be implemented as a silicon single-mode ridge waveguide and may have a width that is about 3 μm. In another embodiment, the second width 91 is about 4.4 μm. As an example, the ESD protection structure extension 231 may be implemented as a silicon multi-mode ridge waveguide and may have a width that is about 4.4 μm.

The waveguide 20 may be a specific implementation of waveguide 120 of FIG. 1 and may be as previously described. Waveguide 20 may include a parallel region and a tapered region. For example, the tapered region may have a tapered region length 93 that is configured to optically couple the waveguide 20 to the secondary waveguide 70 adiabatically. In various embodiments, the tapered region length 93 is between about 125 μm and about 500 μm. In one embodiment, the tapered region length is about 250 μm. A parallel region length 94 of the parallel region of waveguide 20 measured from the ESD protection structure extension 231 to the beginning of the tapered region may be between about 1 μm and about 20 μm. However, in other embodiments, the parallel region length 94 may be larger or smaller depending on specific details of a given application.

A first waveguide width 95 of the parallel region of waveguide 20 may be between about 250 nm and about 500 nm. In one embodiment the first waveguide width 95 is about 350 nm. In various embodiments, a second waveguide width 96 of the end of the tapered region of waveguide 20 is between about 50 nm and about 150 nm. In one embodiment, the second waveguide width 96 is about 80 nm. In some cases, the first width 90 and the second waveguide width 96 may be comparable sizes. In various embodiments, the ratio of the second waveguide width 96 to the first width 90 is between about 1:1 and about 1:3. In one embodiment, the ratio of the second waveguide width 96 to the first width 90 is about 1:1.25. In another embodiment, the ratio of the second waveguide width 96 to the first width 90 is about 1:2.25.

The secondary waveguide 70 may have similar properties as waveguide 20. In some embodiments, the secondary waveguide 70 is electrically insulating. In other embodiments, the secondary waveguide 70 is electrically non-insulating. In one embodiment, the secondary waveguide 70 is formed from silicon nitride ($Si_3N_4$). The secondary waveguide 70 may be wider than waveguide 20. For example, the secondary waveguide 70 may include a secondary waveguide width 97 that is between about 500 nm and about 1 μm. In one embodiment, the secondary waveguide width 97 may be about 700 nm. Alternatively, the secondary waveguide width 97 may be the same or different than the first waveguide width 95. The specific widths of the waveguides may depend on the materials used and the types of optical signals transmitted.

Referring now to FIGS. 2B and 2C, cross-sectional views of the slices 2B and 2C as indicated in FIG. 2A are shown. The waveguide 20 and the ESD protection structure 230 are formed on a substrate 10 as shown. Substrate 10 may include an insulating layer 11 and a semiconducting layer 12. In one embodiment, the substrate 10 is a silicon-on-insulator (SOI) wafer and the insulating layer 11 is silicon dioxide ($SiO_2$) and the semiconductor layer is elemental silicon (Si). Alternatively, substrate 10 may be a silicon wafer, silicon-on-sapphire (SOS) wafer, III-V semiconductor wafer, silicon carbide (SiC) wafer, or any other type of suitable wafer as may be apparent to one of ordinary skill in the art. Additionally, the insulating layer 11 may be formed on or in a bulk substrate. For example, the insulating layer 11 may be a buried oxide (BOX) structure.

As shown in FIG. 2B, the waveguide 20 may be implemented as a ridge waveguide in the parallel region. The waveguide 20 may be surrounded by cladding layers 80 formed from materials with a lower index of refraction than the waveguide 20. The cladding layers 80 may comprise several dielectric layers. For example, the cladding layers 80 may comprise alternating thick dielectric layers 82 and thin dielectric layers 84. Alternatively, the cladding layers 80 may be formed from only thick dielectric layers or only thin dielectric layers. In some cases, the cladding layers 80 may be replaced by a single dielectric layer. In one embodiment, the thick dielectric layers 82 are formed from silicon dioxide ($SiO_2$). In one embodiment, the thin dielectric layers 84 are formed from silicon nitride ($Si_3N_4$).

Now referring to FIG. 2C, the waveguide 20 may be implemented as a strip waveguide in the tapered region as shown. The cladding layers 80 may be different in the tapered region and also may be different in regions where the secondary waveguide 70 overlaps with waveguide 20. For example, additional thick dielectric layers 82 and thin dielectric layers 84 may be included around the secondary waveguide 70 as shown. It should be noted that the various thick dielectric layers 82 may have different thicknesses and be composed of different materials. Similarly, the thin dielectric layers 84 need not be identical in composition or dimension.

FIG. 3 illustrates a schematic diagram of an example OIC system including an ESD protection structure in direct contact with a plurality of waveguides in accordance with an embodiment of the invention.

Referring to FIG. 3, an OIC system 300 includes an OIC device 302. The OIC system 300 including OIC device 302 may be a specific implementation of other embodiment OC systems and OIC devices such as OIC system 100 including OIC device 102 as described in reference to FIG. 1, for example. Similarly labeled elements may be as previously described.

OIC device 302 includes a plurality of waveguides 321 optically coupled to a plurality of secondary waveguides 371. The plurality of waveguides 321 includes a first waveguide 22 and additional waveguides up to an nth waveguide 23 as shown. Similarly, the plurality of secondary waveguides 371 includes a first secondary waveguide 72 optically coupled to the first waveguide 22 and additional secondary waveguides up to an nth secondary waveguide 73 as shown. Each of the waveguides of the plurality of waveguides 321 may be a similar to waveguide 20 of FIG. 2A as previously described. In the same way, each of the plurality of secondary waveguides 371 may be similar to secondary waveguide 70 of FIG. 2A as previously described.

Each of the plurality of secondary waveguides 371 may be optically coupled to an optical connection 13 connected to an external circuit 14. An ESD protection structure 330 is in direct contact with and electrically coupled to each of the plurality of waveguides 321. The ESD protection structure 330 is further electrically coupled to a ground connection 56 through an ESD diode 50 as previously described.

The ESD protection structure 330 may extend around a perimeter of the OIC device 302. In one embodiment, ESD protection structure 330 is formed from elemental silicon (Si) which fully encloses OIC device 302. Alternatively, ESD protection structure 330 may make electrical contact with another material that surrounds OIC device 302. For example, a seal ring formed from an optically opaque, electrically conductive material may be disposed around the perimeter of the OIC device 302. For example, a seal ring may be formed during BEOL processes and may be preferred to as a BEOL seal ring. The ESD protection structure 330 may extend partially or fully around OIC device 302 and be electrically coupled to the BEOL seal ring. In one embodiment, ESD protection structure 330 is electrically coupled to a BEOL seal ring that is formed from a metal.

Figure 4A:
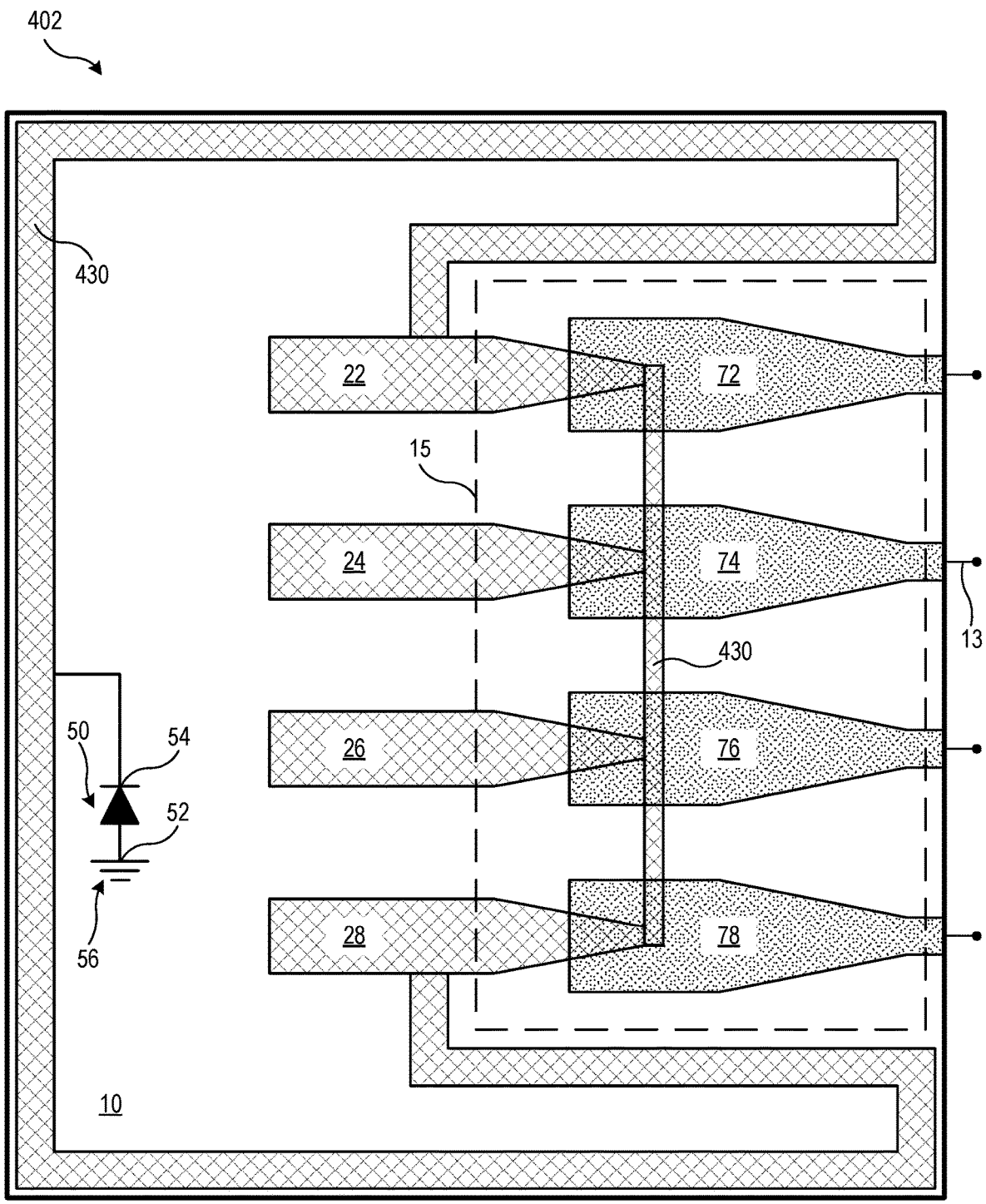

FIGS. 4A and 4B illustrate schematic diagrams of two example OIC systems including an ESD protection structure disposed along the perimeter of an OIC device and in direct contact with four waveguides, where FIG. 4A illustrates four waveguides adiabatically coupled to four secondary waveguides, and where FIG. 4B illustrates four waveguides adiabatically coupled to waveguides of an external interposer in accordance with an embodiment of the invention.

Referring to FIG. 4A, an OIC device 402 includes an ESD protection structure 430 in direct contact with four waveguides 22, 24, 26, and 28. The OIC device 402 may be a specific implementation of other embodiment OC devices such as OIC device 302 as described in reference to FIG. 3, for example. Similarly labeled elements may be as previously described.

OIC device 402 includes four secondary waveguides 72, 74, 76, and 78 disposed in a cavity 15 and optically coupled to a corresponding waveguide 22, 24, 26, and 28 as shown. The four secondary waveguides 72, 74, 76, and 78 may be disposed near an outer surface of the cavity 15 in order to facilitate external optical coupling, such as to an external interposer. Alternatively, the four secondary waveguides 72, 74, 76, and 78 may be omitted and waveguides 22, 24, 26, and 28 may be disposed near the outer surface of the cavity and be optically coupled directly to an external interposer. Each of the waveguides 22, 24, 26, and 28 may be a similar to waveguide 20 of FIG. 2A as previously described. In the same way, each of the secondary waveguides 72, 74, 76, and 78 may be similar to secondary waveguide 70 of FIG. 2A as previously described.

The cavity 15 may be a hollow region formed within BEOL metal layers and may facilitate optical coupling of OIC device 402 to external circuits. For example, OIC device 402 may be a photonic chip and may by optically coupled to an external medium, interposer, or support structure in the region of cavity 15. The cavity may have a depth of several micrometers. For example, the depth of cavity 15 may be between about 1 µm and about 5 µm. In one embodiment, the depth of cavity 15 is about 3 µm.

ESD protection structure 430 may be a specific implementation of ESD protection structure 330 of FIG. 3 and may be as previously described. For example, the ESD protection structure 430 may be disposed along the perimeter of OIC device 402 and the boundaries of cavity 15 as shown. In one embodiment, OIC device 402 is a photonic chip and ESD protection structure 430 extends along the edges of the photonic chip. The ESD protection structure 430 may completely surround OICs of the OIC device that are sensitive to ESD events. In one embodiment, the ESD protection structure 430 is formed from elemental silicon (Si). In one embodiment, the ESD protection structure 430 is implemented using single-mode waveguides. In another embodiment, the ESD protection structure 430 is implemented using multi-mode waveguides.

Referring now to FIG. 4B, an OIC device 403 includes an ESD protection structure 430 in direct contact with four waveguides 22, 24, 26, and 28. OIC device 403 may be similar to OIC device 402 with the exception that the four waveguides 22, 24, 26, and 28 are adiabatically coupled to an external interposer 17 rather than secondary waveguides. The external interposer 17 may include one or more waveguides which are coupled to optical connections 13. OIC device 403 may be a specific implementation of other embodiment OC devices such as OIC device 302 as described in reference to FIG. 3, for example. Similarly labeled elements may be as previously described.

Figure 5:
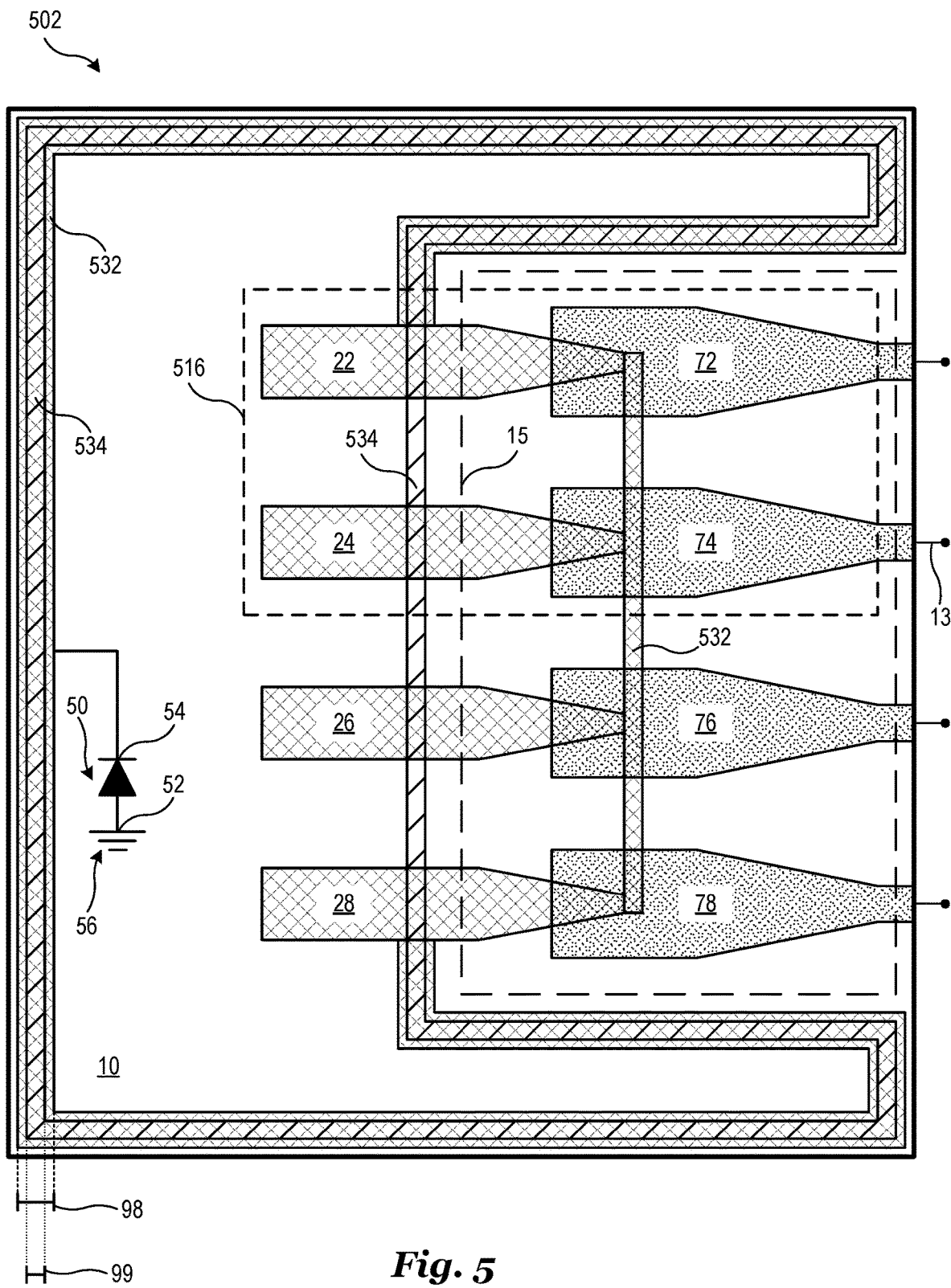
FIG. 5 illustrates a schematic diagram of an example OIC system including a first ESD protection structure in direct contact with four waveguides and a second ESD protection structure that does not directly contact the four waveguides in accordance with an embodiment of the invention.

FIG. 5 illustrates a schematic diagram of an example OIC system including a first ESD protection structure in direct contact with four waveguides and a second ESD protection structure that does not directly contact the four waveguides in accordance with an embodiment of the invention.

Referring to FIG. 5, an OIC device 502 includes a first ESD protection structure 532 in direct contact with four waveguides 22, 24, 26, and 28 and a second ESD protection structure 534 that does not directly contact the four waveguides 22, 24, 26, and 28. The OIC device 502 may be a specific implementation of other embodiment OC devices such as OIC device 302 as described in reference to FIG. 3, for example. Similarly labeled elements may be as previously described.

The first ESD protection structure 532 may be a specific implementation of ESD protection structure 430 of FIG. 4B and may be as previously described. The second ESD protection structure 534 may be formed from an optically opaque, electrically conductive material. For example, the second ESD protection structure 534 may surround OIC device 502 and may be referred to as a seal ring. For example, a seal ring may be formed during BEOL processes and may be referred to as a BEOL seal ring.

The first ESD protection structure 532 may have a first ESD width 98. The first ESD width 98 may be substantially constant or may vary in different regions of the perimeter of the OIC device 502. In one embodiment, the first ESD width 98 is about 400 nm. For example, the first ESD protection structure 532 may be implemented as a silicon single-mode waveguide and may have a width that is about 400 nm. In another embodiment, the first ESD width 98 is about 1.8 µm. For example, the first ESD protection structure 532 may be implemented as a silicon single-mode waveguide and may have a width that is about 1.8 µm. In other embodiments, the first ESD width 98 is between about 2 µm and about 5 µm. In one embodiment, the first ESD width 98 is about 3 µm. In another embodiment, the first ESD width 98 is about 4.4 µm.

The second ESD protection structure 534 may have a second ESD width 99. The second ESD width 99 may be the same or different then the first ESD width 98. In various embodiments, the second ESD width 99 is greater than the first ESD width 98. In one embodiment, the second ESD width 99 is about 1 µm. Alternatively, the second ESD width 99 is less than or equal to about 10 µm and is about 10 µm in one embodiment.

As shown in FIG. 5, a portion 516 of OIC device 502 includes a first waveguide 22 and a second waveguide 24 which are both in direct contact with and electrically coupled to the first ESD protection structure 532. However, as illustrated, the first waveguide 22 directly contacts the first ESD protection structure 532 at the tapered end of the waveguide as well as a side portion of the waveguide whereas the second waveguide 24 directly contacts the first ESD protection structure 532 at only the tapered end of the waveguide. In this way, electrical coupling between waveguides and ESD protection structures may be achieved in different ways based on the geometry of a given application.

In this specific example, the first ESD protection structure follows the edge of the cavity 15 until reaching the first waveguide 22. The first waveguide 22 is formed from an electrically non-insulating material and therefore provides a non-insulating pathway to the tapered end of the first waveguide 22 where the first ESD protection structure 532 again makes contact with the first waveguide 22. Each of the interior waveguides such as the second waveguide 24 makes direct contact with the first ESD protection structure 532 only at the tapered end of the waveguide. Since the fourth waveguide 28 is located at an edge of the cavity 15, it makes direct contact with the first ESD protection structure 532 in a similar manner as the first waveguide 22.

Figure 6B:
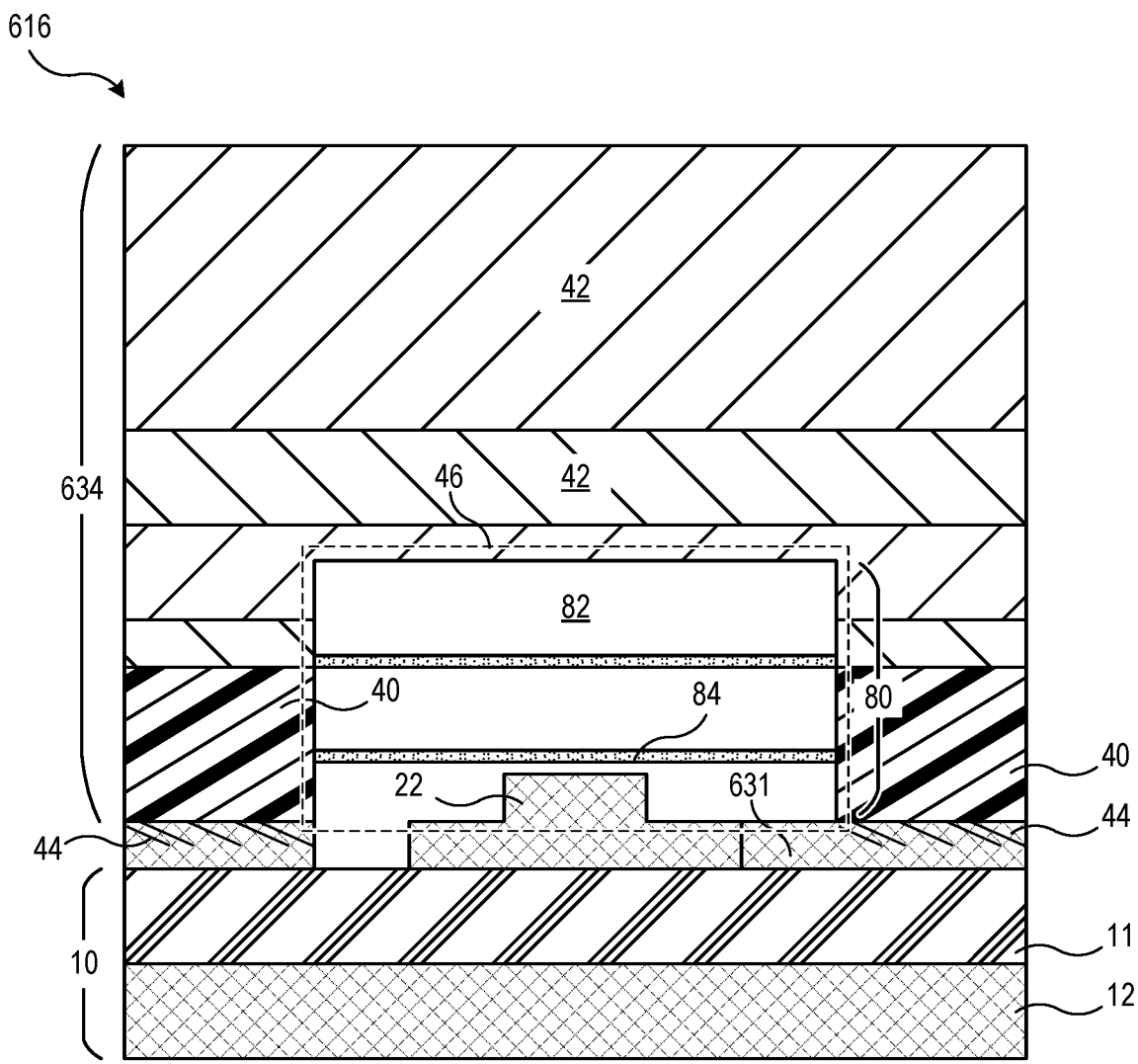
Figure 6C:
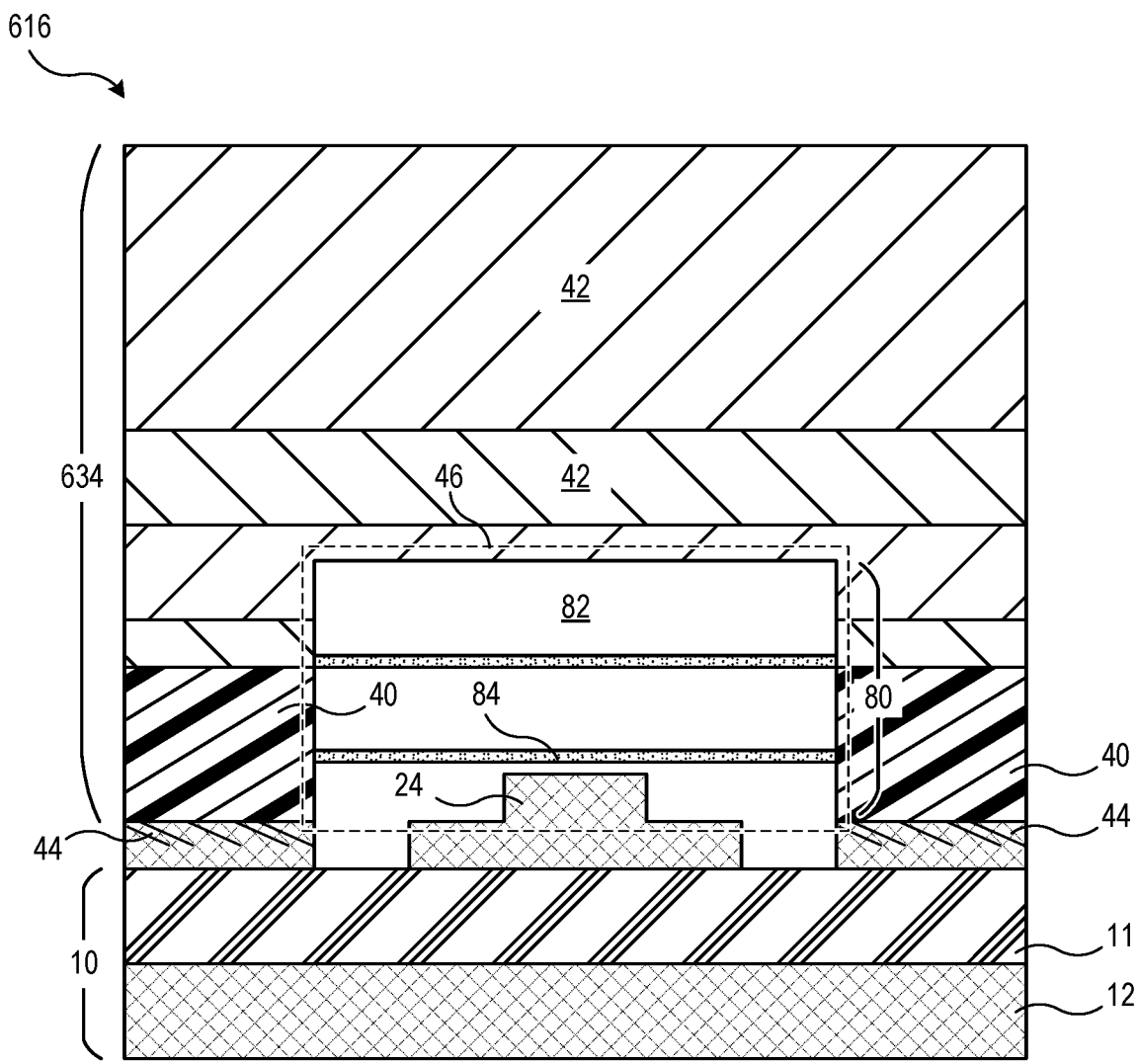

FIGS. 6A, 6B, 6C, 6D, 6E, and 6F illustrate a schematic diagram of a portion of an example OIC system including a first ESD protection structure in direct contact with a first waveguide and a second waveguide, and a second ESD protection structure that does not directly contact the first waveguide or the second waveguide, where FIG. 6A illustrates a top view of the portion, and where FIGS. 6B-6F illustrate cross-sectional views of the portion in accordance with an embodiment of the invention.

Referring to FIG. 6A, a portion 616 of an OIC device includes a first ESD protection structure 632 in direct contact with a first waveguide 22 and a second waveguide 24. The portion 616 of an OIC device may be a specific implementation of other embodiment portions of OIC devices such as the portion 516 of OIC device 502 as described in reference to FIG. 5, for example. Similarly labeled elements are as previously described.

The first ESD protection structure 632 includes an ESD protection structure extension 631 that directly contacts a side region of the first waveguide 22 as shown. The first ESD protection structure 632 may be a specific implementation of the first ESD protection structure 532 of FIG. 5, for example. In addition to the first width 90 and second width 91 of first ESD protection structure 632, a third width 92 may be defined that represents the width of the first ESD protection structure 632 in a region between waveguides. In various embodiments, the third width 92 is substantially similar to the second width 91. In various embodiments, the third width 92 is between about 250 nm and about 500 µm. In one embodiment, the third width 92 is about 400 nm. In other embodiments, the third width 92 is between about 500 nm and about 2 µm. In one embodiment, the third width 92 is about 1.8 µm.

For example, as illustrated, the width of the first ESD protection structure 632 may be increased between the first waveguide 22 and the second waveguide 24. Alternatively or additionally, the width of the first ESD protection structure 632 may be increased between the first secondary waveguide 72 and the second secondary waveguide 74. This may advantageously enable more reliable fabrication of the first ESD protection structure 632 while maintaining the integrity of optical signals transmitted by the first waveguide 22 and the second waveguide 24. For example, optical signals transmitted by the waveguides of a given OIC device may be affected by thick structures in the vicinity of the waveguides. However, in the regions between the waveguides that are not in the immediate vicinity of a waveguide, thick structures may not affect the optical signals.

The portion 616 of an OIC device also includes a second ESD protection structure 634 that passes over the first waveguide 22, the second waveguide 24, and the ESD protection structure extension 631. The second ESD protection structure 634 may be a specific implementation of the second ESD protection structure 534 of FIG. 5 and may be as previously described.

Referring now to FIGS. 6B-6F, cross-sectional views of the slices 6B, 6C, 6D, 6E, and 6F as indicated in FIG. 6A are shown. In contrast to the OIC system 200 of FIG. 2, the second ESD protection structure 634 extends over the first waveguide 22 and the second waveguide 24. The second ESD protection structure 634 includes a one or more metal layers 42. The metal layers 42 may be formed during BEOL processes and may include several micrometers of routing for electrical signals. In various embodiments, the metal layers 42 may comprise any combination of metals such as copper (Cu), aluminum (Al), silver (Ag), gold (Au), palladium (Pd), tungsten (W), titanium (Ti), zinc (Zn), tin (Sn), lead (Pb) and the like. In one embodiment, the metal layers 42 comprise elemental copper (Cu). In one embodiment, the metal layers 42 comprise elemental aluminum (Al). The individual metal layers 42 need not be identical in composition or thickness.

The second ESD protection structure 634 may make electrical contact to a semiconducting surface of substrate 10 and/or the first ESD protection structure 632 using optional contacts 40. The contacts 40 may comprise a conductive material such as a metal, metal alloy, polysilicon, and the like. In the specific example that the first ESD protection structure 632 is formed from elemental silicon (Si), an optional silicide layer 44 may be included to facilitate electrical coupling between the contacts 40 and the silicon.

The second ESD protection structure 634 may include openings 46 to allow room for the cladding layers 80. The cladding layers 80 may be sufficiently large to prevent scattering of evanescent waves created by optical signals propagating through the first waveguide 22 and the second waveguide 24. Since the openings 46 do not directly contact the first waveguide 22 or the second waveguide 24, electrical charge may not flow from the waveguides to the second ESD protection structure 634. Rather, the first ESD protection structure 632 is electrically coupled to the first waveguide 22 and the second waveguide 24 and may conduct electrical charge away from the waveguides. Therefore, in the absence of the first ESD protection structure 632, a pathway for electrical charge to enter the OIC device may exist through the waveguides. The first ESD protection structure 632 advantageously allows electrical charge (e.g. during an ESD event) to be shunted away from the waveguides to a ground connection.

Figure 6D:
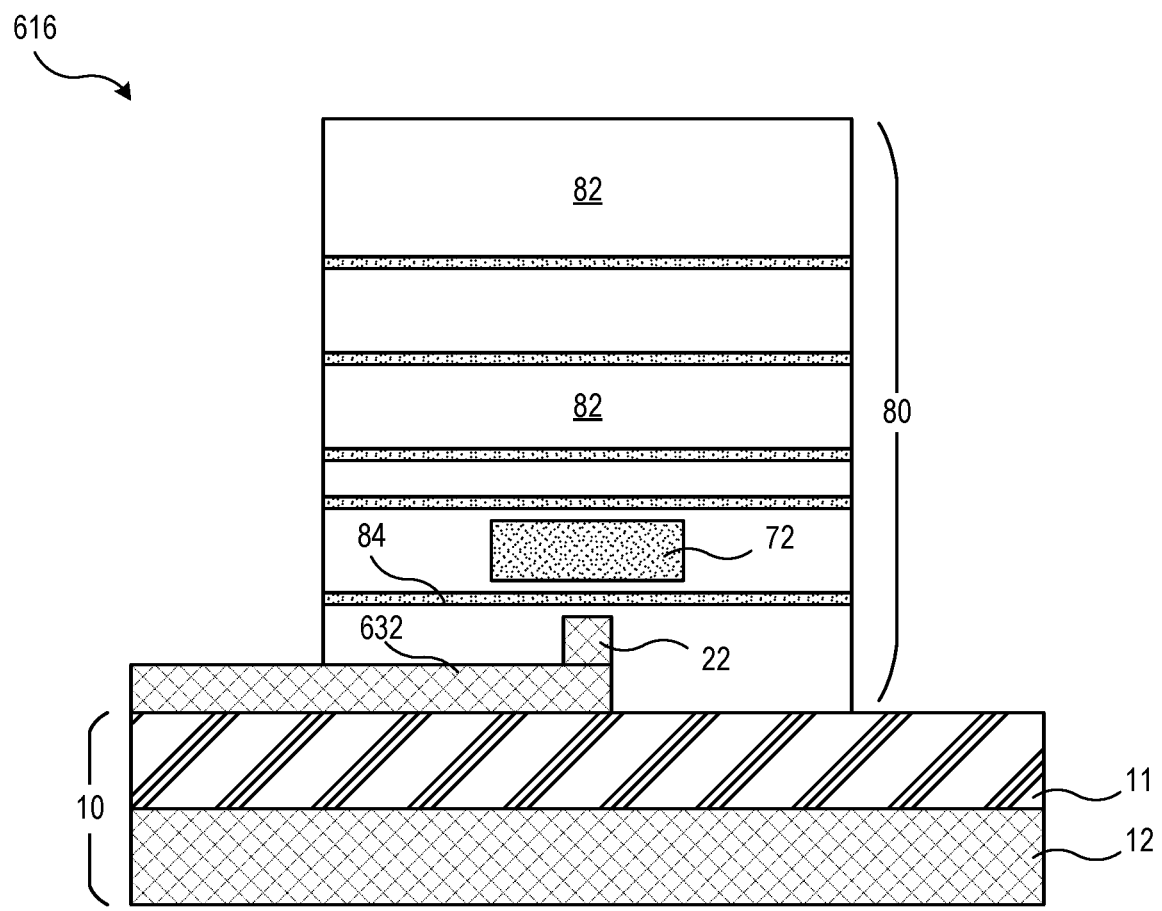
Figure 6E:
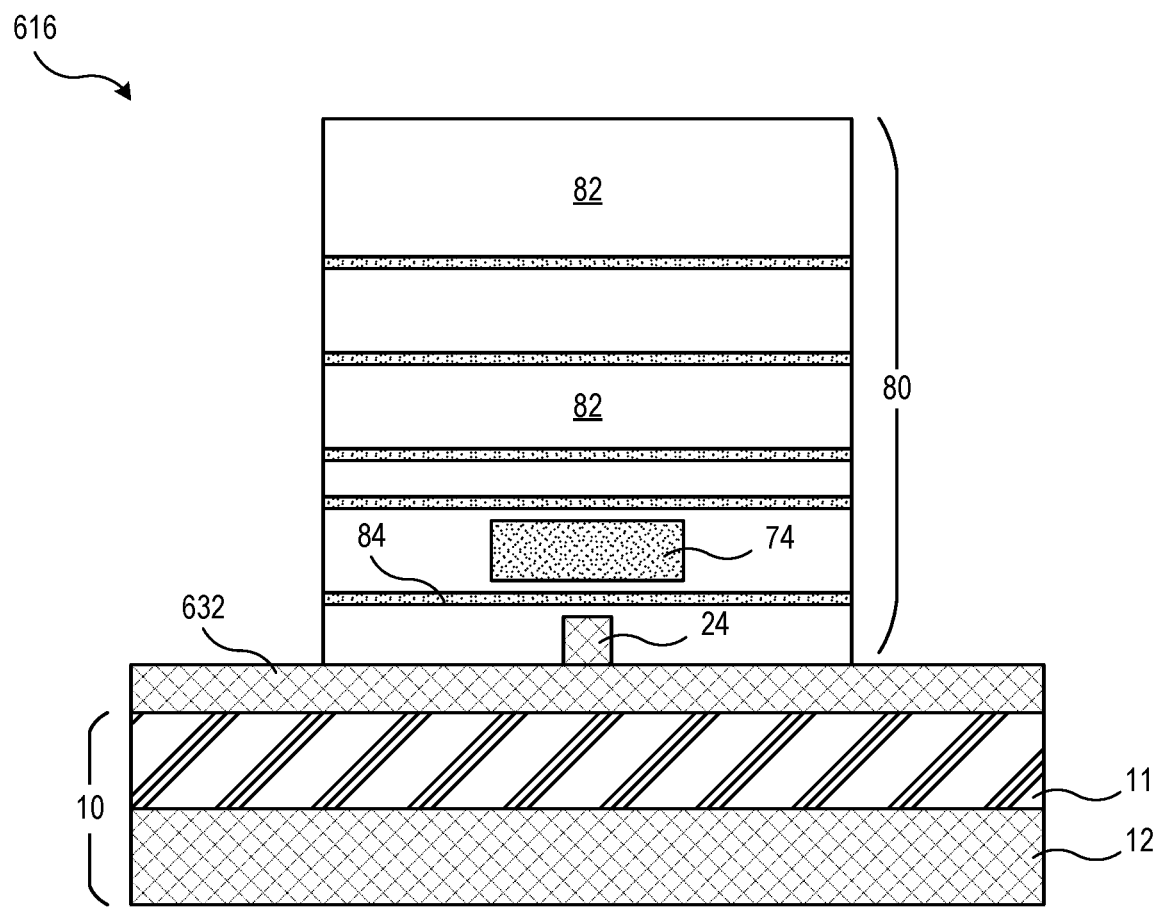
Figure 6F:
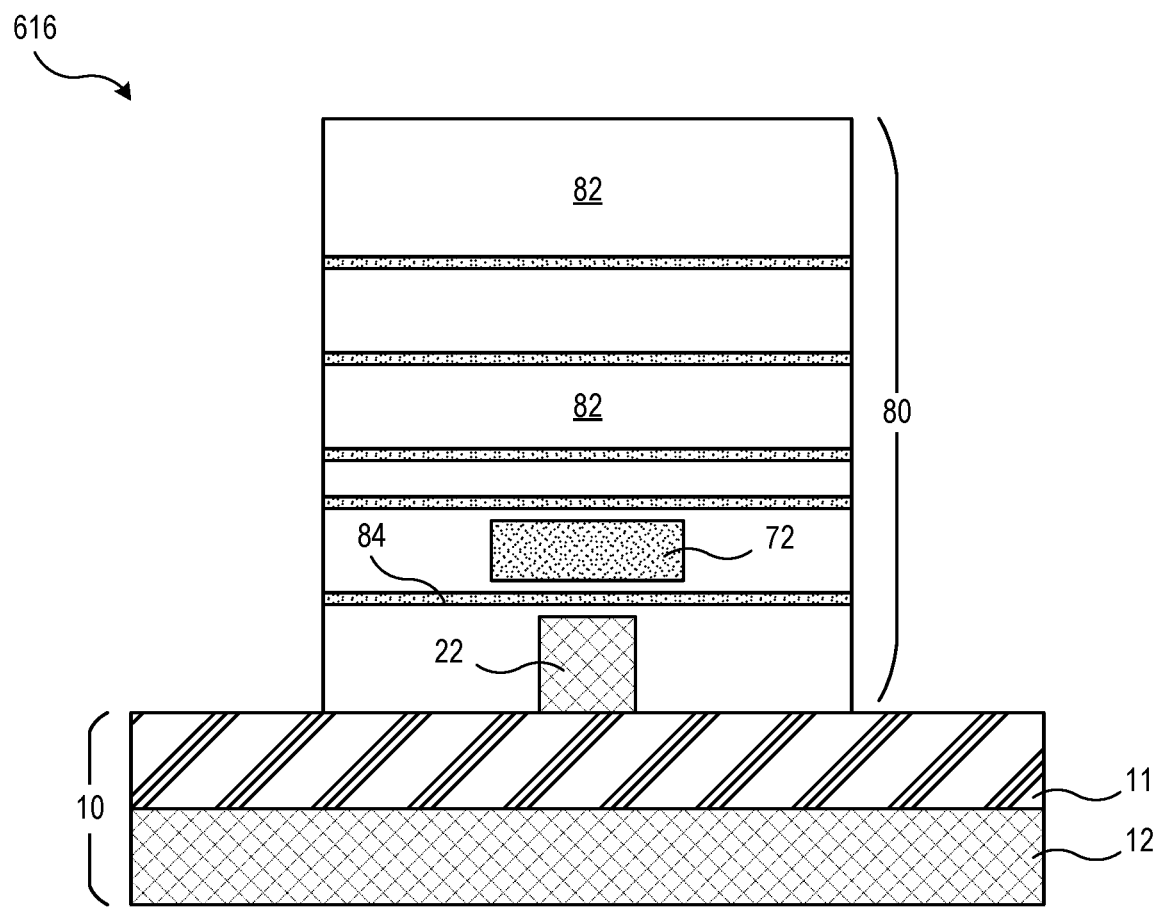

As shown in FIGS. 6D and 6E, the second ESD protection structure 634 does not extend over the first waveguide 22 and the second waveguide 24 in the tapered regions of the waveguides. A cross-sectional view of the first waveguide 22 in the interior of the tapered region is also shown in FIG. 6F where neither the first ESD protection structure 632 nor the second ESD protection structure 634 are present. In this region, the first waveguide 22 is completely surrounded by the cladding layers 80 and the insulating layer 11 and is substantially electrically isolated.

Figure 7A:
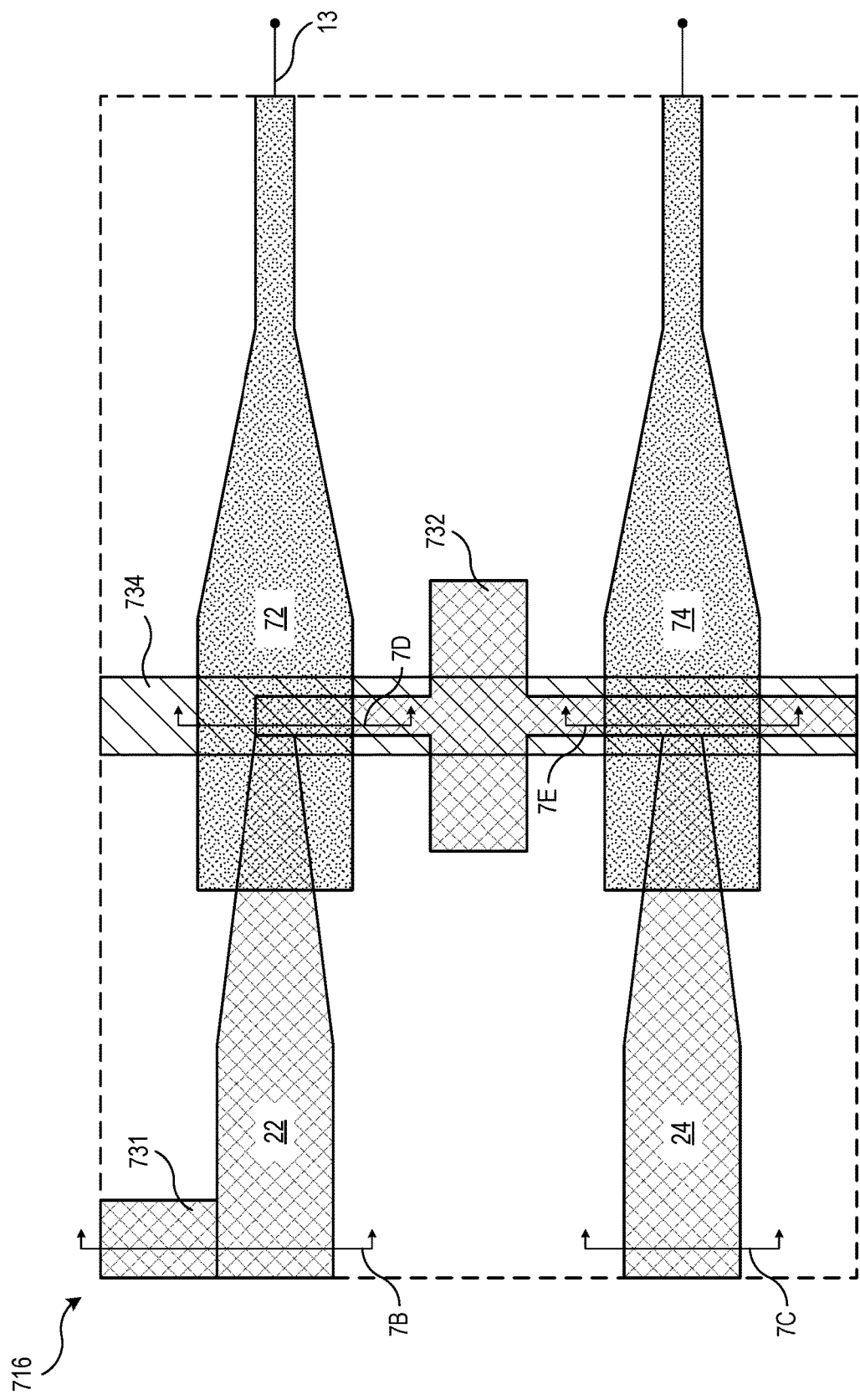
FIGS. 7A, 7B, 7C, 7D, and 7E illustrate a schematic diagram of a portion of another example OIC system including a first ESD protection structure in direct contact with a first waveguide and a second waveguide, and a second ESD protection structure that does not directly contact the first waveguide or the second waveguide, where
Figure 7B:
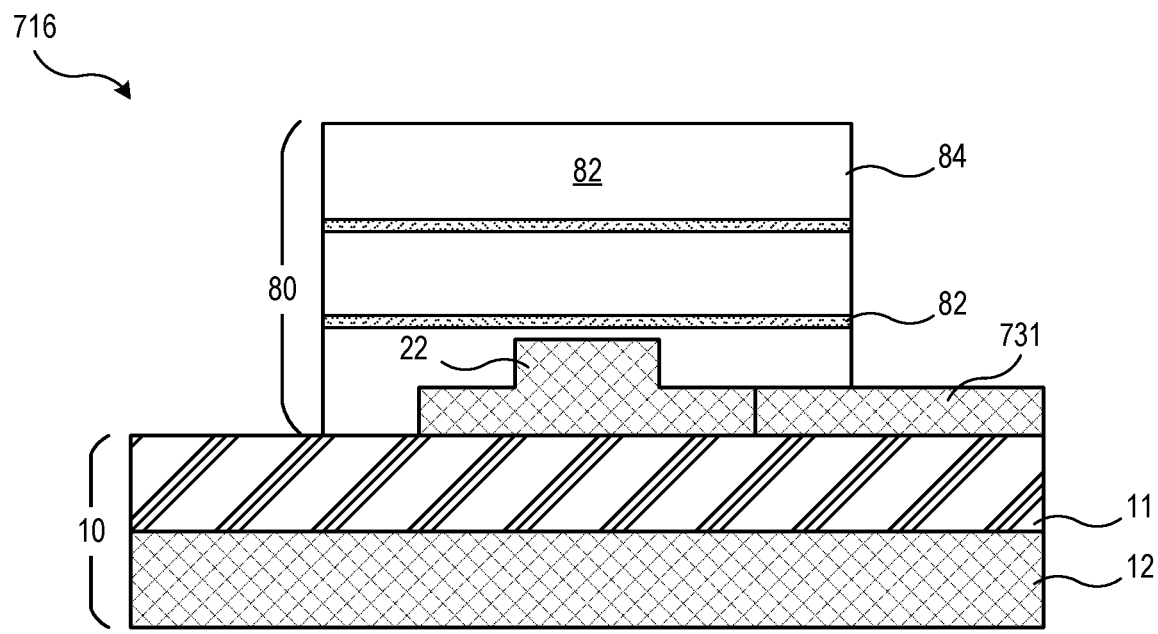
Figure 7C:
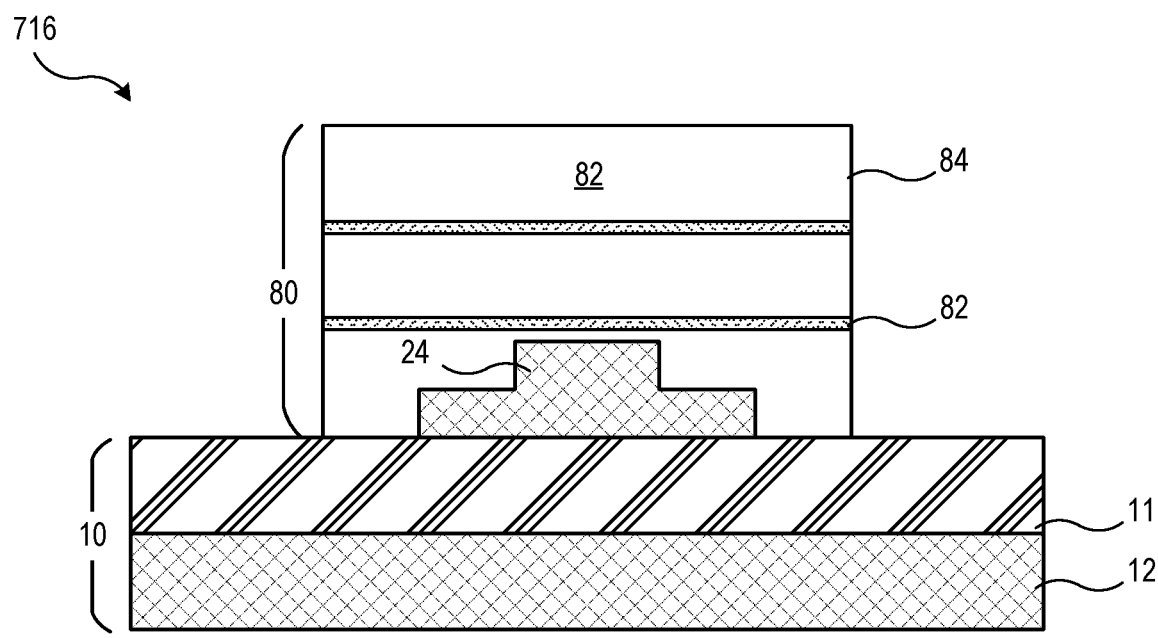
Figure 7D:
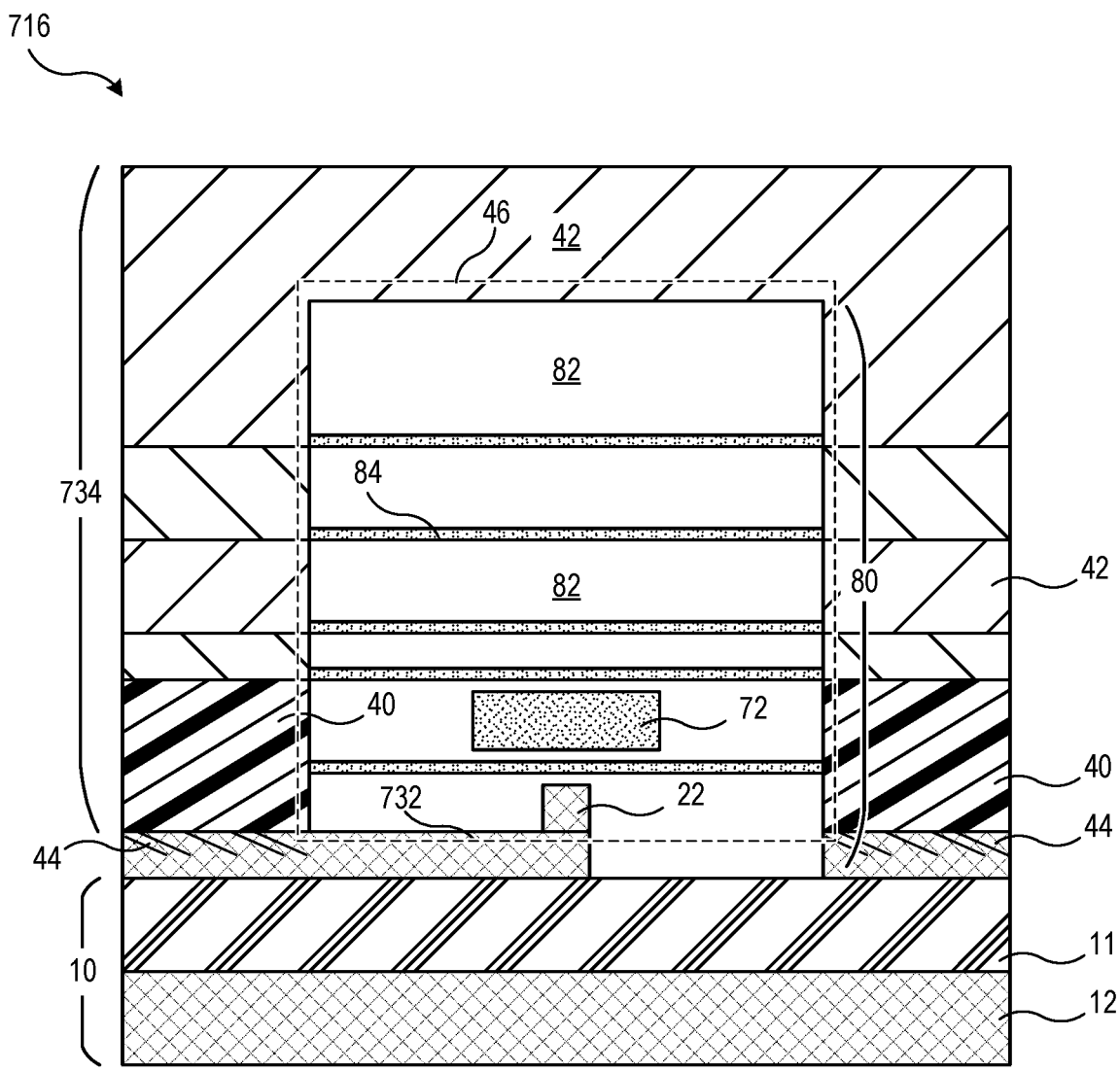
Figure 7E:
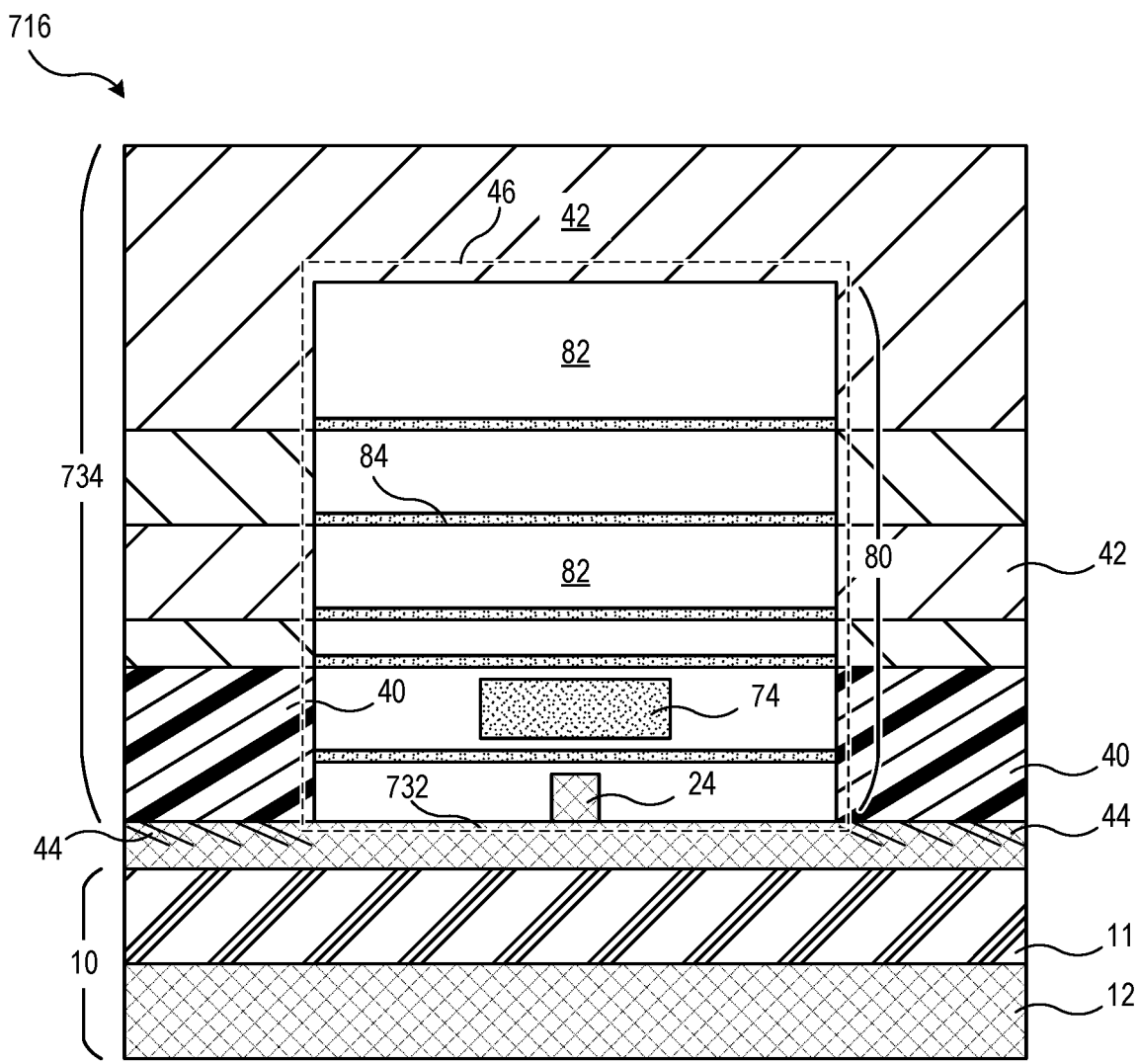

FIGS. 7A, 7B, 7C, 7D, and 7E illustrate a schematic diagram of a portion of another example OIC system including a first ESD protection structure in direct contact with a first waveguide and a second waveguide, and a second ESD protection structure that does not directly contact the first waveguide or the second waveguide, where FIG. 7A illustrates a top view of the portion, and where FIGS. 7B-7E illustrate cross-sectional views of the portion in accordance with an embodiment of the invention.

Referring to FIG. 7A, a portion 716 of an OIC device includes a first ESD protection structure 732 in direct contact with a first waveguide 22 and a second waveguide 24. The first ESD protection structure 732 also includes an ESD protection structure extension 731 that directly contacts a side region of the first waveguide 22 as shown. The portion 716 of an OIC device may be a specific implementation of other embodiment portions of OIC devices such as the portion 516 of OIC device 502 as described in reference to FIG. 5, for example. Similarly labeled elements are as previously described.

The portion 716 of an OIC device is similar to portion 616 of FIG. 6A, except that portion 716 includes a second ESD protection structure 734 that passes over the tapered ends of the first waveguide 22 and the second waveguide 24 as well as the first secondary waveguide 72 and the second secondary waveguide 74. The second ESD protection structure 734 may be a specific implementation of the second ESD protection structure 534 of FIG. 5 and may be as previously described. It should be noted that although the second ESD protection structure 734 is illustrated as being wider than the first ESD protection structure 732, this is not necessarily the case. The second ESD protection structure 734 may also be substantially the same width or thinner than the first ESD protection structure 732 depending on the specific details of a given application.

Referring now to FIGS. 7B-7E, cross-sectional vies of the slices 7B, 7C, 7D, and 7E as indicated in FIG. 7A are shown. In contrast to the OIC system 200 of FIG. 2 and the portion 616 of an OIC device of FIG. 6, the second ESD protection structure 734 extends over the first secondary waveguide 72 and the second secondary waveguide 74 as well as the first waveguide 22 and the second waveguide 24. The second ESD protection structure 734 includes one or more metal layers 42 which may be as previously described.

Figure 8:
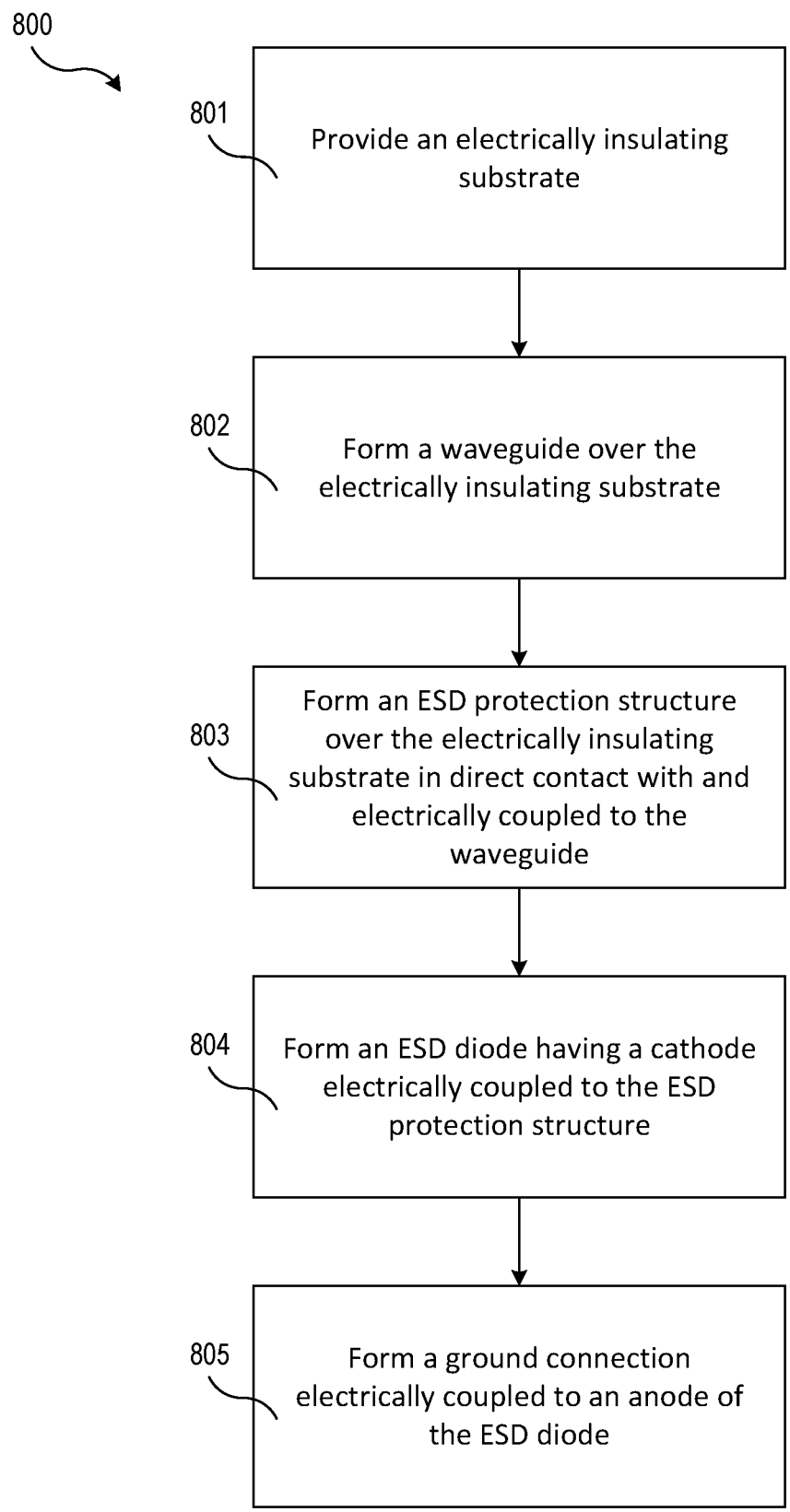
FIG. 8 illustrates a method of fabricating an OIC device in accordance with an embodiment of the invention.

FIG. 8 illustrates a method of fabricating an OIC device in accordance with an embodiment of the invention. The method 800 may be used to fabricate any of the OIC devices as described herein. For example, the method 800 may be used to fabricate the OIC device 502 as described in reference to FIG. 5. The following steps of method 800 may be performed in any order and are not intended to be exhaustive. Additional steps may be added to method 800 and one or more steps may be removed from method 800 as may be apparent to one of ordinary skill in the art. The steps of method 800 are not necessarily performed sequentially and any number of steps of method 800 may be performed concurrently.

Step 801 of fabricating the OIC device includes providing a substrate. The substrate may be electrically insulating in various embodiments. For example, the substrate may be an SOI substrate, SOS substrate, or any suitable substrate. In one embodiment, the substrate is a bulk silicon substrate including an electrically insulating BOX structure.

Step 802 of fabricating the OIC device includes forming one or more waveguides over the substrate. The waveguides may be configured to be optically connected to an external optical circuit. For example, each of the waveguides may have an index of refraction $n_1$ and be optically connected to a corresponding secondary waveguide with an index of refraction $n_2$ that is configured to be optically coupled to a waveguide with and index of refraction $n_3$ on an external interposer. The waveguide materials may be chosen so that the indices of refraction satisfy $n_1 > n_2 > n_3$ and adiabatic coupling is achieved.

The one or more waveguides may be electrically non-insulating in various embodiments. For example, the one or more waveguides are formed from elemental silicon (Si) in one embodiment. The one or more waveguides may be configured to transmit one or more optical signals. The secondary waveguides are silicon nitride ($Si_3N_4$) in one embodiment. The waveguides of an external interposer may be formed from a polymer or glass.

Step 803 of fabricating the OIC device includes forming an ESD protection structure over the substrate in direct contact with and electrically coupled to the one or more waveguides. The ESD protection structure is electrically non-insulating in various embodiments. In some embodiments, the ESD protection structure is substantially optically transparent to the one or more optical signals. In one embodiment, the ESD protection structure is formed of the same material as the one or more waveguides. In one embodiment, steps 802 and 803 are performed concurrently.

Step 804 of fabricating the OIC device includes forming an ESD diode that has a cathode electrically coupled to the ESD protection structure. The ESD diode may be on or in the substrate. A ground connection that is electrically coupled to an anode of the ESD diode may be formed in a step 805. The ground connection and ESD diode may be formed at any time prior to, during, or after the formation of the ESD protection structure. For example, steps 804 and 805 may be performed concurrently and before steps 802 and 803. The exact timing of the steps may depend on the specific details of a given application.

The ESD protection structure may be disposed along a perimeter of the OIC device in various embodiments. In one embodiment, the ESD protection structure completely surrounds the OIC device and may be referred to as an optical seal ring. A second ESD protection structure may optionally be formed over the substrate. For example, the second ESD protection structure may be formed during BEOL processes. In various embodiments, the second ESD protection structure is formed from a metal or combination of metals. In one embodiment, the second ESD protection structure comprises elemental copper (Cu). In one embodiment, the second ESD protection structure comprises elemental aluminum (Al). The second ESD protection structure may extend along a perimeter of the OIC device. In one embodiment, the second ESD protection structure completely surrounds the OIC device and may be referred to as a seal ring or as a BEOL seal ring in order to distinguish it from an optical seal ring.

Example embodiments of the invention are summarized here. Other embodiments can also be understood from the entirety of the specification as well as the claims filed herein.

Example 1

An optical integrated circuit device, including an electrically insulating substrate; an optical connection disposed at a boundary of the optical integrated circuit, the optical connection including a first waveguide, where the first waveguide is disposed on the electrically insulating substrate and configured to transmit an optical signal; a first electrostatic discharge (ESD) protection structure in direct contact with and electrically coupled to the first waveguide, the first ESD protection structure being both electrically non-insulating and substantially optically transparent to the optical signal; an ESD diode including an anode and a cathode, the cathode being electrically coupled to the first ESD protection structure; and a ground connection electrically coupled to the anode of the ESD diode.

Example 2

The device according to example 1, where the first waveguide is a silicon waveguide.

Example 3

The device according to one of examples 1 and 2, where the optical connection includes a second waveguide optically and adiabatically coupled to a portion of the first waveguide.

Example 4

The device according to one of examples 1 to 3, where the first ESD protection structure is disposed around a perimeter of the optical integrated circuit device, and where the first ESD protection structure forms a closed loop.

Example 5

The device according to one of examples 1 to 4, further including one or more back end-of-line (BEOL) layers overlying the electrically insulating substrate; and a cavity in the one or more BEOL layers, where a portion of the first waveguide is disposed in the cavity.

Example 6

The device according to one of examples 1 to 5, further including a second ESD protection structure disposed around a perimeter of the optical integrated circuit device, where the second ESD protection structure is both electrically conductive and substantially optically opaque to the optical signal; the second ESD protection structure includes an opening through which the first waveguide passes; and the second ESD protection structure forms a closed loop.

Example 7

The device according to one of examples 1 to 6, where a width of a portion of the first ESD protection structure is less than 200 nm; the width is measured along a direction parallel to a direction of propagation of the optical signal; and the portion of the first ESD protection structure directly contacts the first waveguide.

Example 8

A method of fabricating an optical integrated circuit device, the method including providing an electrically insulating substrate; forming a first waveguide over the electrically insulating substrate, where the first waveguide is configured to transmit an optical signal; forming a first electrostatic discharge (ESD) protection structure over the electrically insulating substrate, the first ESD protection structure being in direct contact with and electrically coupled to the first waveguide, where the first ESD protection structure is both electrically non-insulating and substantially optically transparent to the optical signal; forming an ESD diode at the electrically insulating substrate, where a cathode of the ESD diode is electrically coupled to the first ESD protection structure; and forming a ground connection at the electrically insulating substrate, the ground connection being electrically coupled to an anode of the ESD diode.

Example 9

The method according to example 8, where the first waveguide is a silicon waveguide.

Example 10

The method according to one of examples 8 and 9, further including forming a second waveguide optically and adiabatically coupled to a portion of the first waveguide.

Example 11

The method according to one of examples 8 to 10, where forming the first ESD protection structure includes forming the first ESD protection structure as a closed loop around a perimeter of the optical integrated circuit device.

Example 12

The method according to one of examples 8 to 11, further including forming one or more back end-of-line (BEOL) layers over the electrically insulating substrate; and forming a cavity in the BEOL layers, where a portion of the first waveguide is disposed in the cavity.

Example 13

The method according to one of examples 8 to 12, further including forming a second ESD protection structure as a closed loop around a perimeter of the optical integrated circuit device, the second ESD protection structure including an opening through which the first waveguide passes, where the second ESD protection structure is both electrically conductive and substantially optically opaque to the optical signal.

Example 14

The method according to one of examples 8 to 13, where a width of a portion of the first ESD protection structure is less than 200 nm; the width is measured along a direction parallel to a direction of propagation of the optical signal; and the portion of the first ESD protection structure directly contacts the first waveguide.

Example 15

A system including an electrically insulating substrate; an optical integrated circuit (OIC) disposed over the electrically insulating substrate; a plurality of waveguides disposed over the electrically insulating substrate and optically coupled to the OIC, the plurality of waveguides being configured to transmit a plurality of optical signals, where the plurality of waveguides includes a first waveguide and a second waveguide; an external circuit optically coupled to the plurality of waveguides; a first seal ring disposed around a perimeter of the OIC, where the first seal ring includes a first portion in direct contact with and electrically coupled to each of the plurality of waveguides, the first portion is both electrically non-insulating and substantially optically transparent to the plurality of optical signals, and the first seal ring includes a second portion, the first portion and the second portion forming a closed loop; an ESD diode including an anode and a cathode, the cathode being electrically coupled to the first seal ring; and a ground connection electrically coupled to the anode of the ESD diode.

Example 16

The system according to example 15, where the second portion of the first seal ring is both electrically non-insulating and substantially optically transparent to the plurality of optical signals.

Example 17

The system according to one of examples 15 and 16, further including a second seal ring disposed around the perimeter of the OIC, where the second seal ring is both electrically conductive and substantially optically opaque to the plurality of optical signals, the second seal ring includes a plurality of openings, where each of the plurality of waveguides passes through a respective opening on the plurality of openings, and the second seal ring forms a closed loop.

Example 18

The system according to example 17, where the first seal ring is electrically coupled to the second seal ring.

Example 19

The system according to one of examples 15 to 18, where a first waveguide of the plurality of waveguides is spaced apart from a second waveguide of the plurality of waveguides in a first direction, a first region of the first portion of the first seal ring is in direct contact with the first waveguide, the first region including a first width measured in a second direction perpendicular to the first direction, a second region of the first portion of the first seal ring is in direct contact with the second waveguide, the second region including a second width measured in the second direction, a third region of the first portion of the first seal ring is disposed between the first region and the second region, the third region including a third width measured in the second direction, the first width and the second width are less than 200 nm, and the third width is greater than 200 nm.

Example 20

The system according to example 19, where the first width and the second width are about 180 nm and the third width is about 1 μm.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An optical integrated circuit device comprising:
a semiconductor substrate;
a first waveguide made of a first material and disposed over the semiconductor substrate, the first waveguide comprising a parallel region and a tapered region;
a first cladding structure disposed over and surrounding the parallel region of the first waveguide;
a first extension made of the first material and disposed over the semiconductor substrate, the first extension physically contacting the parallel region of the first waveguide, wherein the first extension comprises a first portion within the first cladding structure and a second portion outside the first cladding structure; and
an electrostatic discharge (ESD) protection structure electrically coupled to the first extension.

2. The device according to claim 1, wherein the first material is silicon and the first waveguide is a silicon waveguide.

3. The device according to claim 1, wherein the first cladding structure comprises a plurality of thin and thick dielectric layers.

4. The device according to claim 1, further comprising:
an electrically insulating layer disposed between the semiconductor substrate and the first waveguide.

5. The device according to claim 1, further comprising:
a second waveguide separated from and at least partially overlapping the first waveguide, wherein the second waveguide is adiabatically coupled to the first waveguide.

6. The device according to claim 1, further comprising:
a second cladding structure disposed over and surrounding the tapered region of the first waveguide; and
a second extension made of the first material and disposed over the semiconductor substrate directly adjacent to and physically contacting the tapered region of the first waveguide, wherein
the second extension comprises a first portion within the second cladding structure and a second portion outside the second cladding structure, and
the second extension is electrically coupled to the ESD protection structure.

7. The device according to claim 1, wherein:
the ESD protection structure is disposed over the first cladding structure and the first waveguide;
the ESD protection structure is both electrically conductive and substantially optically opaque to optical signals; and
the first extension is both electrically conductive and substantially optically transparent to the optical signals.

8. An optical integrated circuit device comprising:
a semiconductor substrate;
a metal structure comprising an opening and disposed over the semiconductor substrate;
a waveguide made of a first material disposed in the opening of the metal structure;
a cladding structure disposed in the opening and between the waveguide and the metal structure;
an extension made of the first material, the extension being disposed below the metal structure, wherein the extension comprises a first portion outside the opening and a second portion extending through the opening and physically contacting the waveguide; and
an electrostatic discharge (ESD) protection structure electrically coupled to the extension.

9. The device according to claim 8, wherein the first material is silicon and the waveguide is a silicon waveguide.

10. The device according to claim 9, wherein the extension is a silicon ridge waveguide.

11. The device according to claim 8, wherein the metal structure comprises a plurality of back end-of-line (BEOL) layers overlying the semiconductor substrate.

12. The device according to claim 8, wherein:
the waveguide comprises a parallel region and a tapered region,
the opening surrounds the parallel region, and
the metal structure and the cladding structure are both disposed over the parallel region.

13. The device according to claim 8, wherein:
the waveguide comprises a parallel region and a tapered region,
the opening surrounds the tapered region, and
the metal structure and the cladding structure are both disposed over the tapered region.

14. The device according to claim 8, further comprising an ESD diode, wherein:
the ESD diode comprises an anode and a cathode;
the ESD protection structure is further electrically coupled to the metal structure and to the cathode of the ESD diode;
the anode of the ESD diode is electrically coupled to a ground connection; and
the extension is both electrically conductive and substantially optically transparent to optical signals.

15. An optical integrated circuit device comprising:
a semiconductor substrate;
a first waveguide made of a first material and disposed over the semiconductor substrate, the first waveguide comprising a first parallel region and a first tapered region, wherein the first waveguide is configured to transmit a first optical signal in a first direction through the first waveguide;
a second waveguide made of the first material disposed over the semiconductor substrate, the second waveguide comprising a second parallel region and a second tapered region, wherein the second waveguide is configured to transmit a second optical signal in a second direction parallel to the first direction through the second waveguide, and wherein the second waveguide is adjacent to and separated from the first waveguide;
a first extension made of the first material and disposed over the semiconductor substrate, the first extension physically contacting the first waveguide, wherein the first extension extends away from the first waveguide in a third direction comprising a first component perpendicular to the first direction; and
an electrostatic discharge (ESD) protection structure electrically coupled to the first extension.

16. The device according to claim 15, wherein the first material is silicon, the first waveguide is a first silicon waveguide, and the second waveguide is a second silicon waveguide.

17. The device according to claim 15, wherein the first extension physically contacts the first tapered region and the second tapered region.

18. The device according to claim 15, further comprising a second extension made of the first material and disposed over the semiconductor substrate, wherein:
the first extension physically contacts the first parallel region;
the second extension physically contacts the second parallel region; and
the second extension extends away from the second waveguide in a fourth direction comprising a second component perpendicular to the first direction and opposite the third direction.

19. The device according to claim 15, further comprising:
a third waveguide separated from and at least partially overlapping the first waveguide, wherein the third waveguide is adiabatically coupled to the first waveguide.

20. The device according to claim 15, wherein:
the ESD protection structure is disposed over the first waveguide and the second waveguide;
the ESD protection structure is both electrically conductive and substantially optically opaque to optical signals; and
the first extension is both electrically conductive and substantially optically transparent to the optical signals.

* * * * *